United States Patent [19]

Ikegawa et al.

[11] Patent Number: 5,629,267
[45] Date of Patent: May 13, 1997

[54] SUPERCONDUCTING ELEMENT HAVING AN INTERMEDIATE LAYER WITH MULTIPLE FLUORITE BLOCKS

[75] Inventors: Sumio Ikegawa, Musashino; Tadao Miura, Yokohama, both of Japan

[73] Assignee: Kabushiki Kaisha Toshiba, Kanagawa-ken, Japan

[21] Appl. No.: 409,966

[22] Filed: Mar. 24, 1995

Related U.S. Application Data

[63] Continuation of Ser. No. 76,892, Jun. 15, 1993, abandoned.

[30] Foreign Application Priority Data

Jun. 16, 1992 [JP] Japan ................................... 4-156854

[51] Int. Cl.⁶ ...................................................... B32B 9/00
[52] U.S. Cl. ........................... 505/238; 428/688; 428/702; 505/193; 505/701; 505/702; 505/239; 257/33; 257/35
[58] Field of Search ...................... 505/701, 702, 505/703, 704, 230–239, 120–126, 193; 428/688, 702, 930; 257/33, 35

[56] References Cited

U.S. PATENT DOCUMENTS

| | | | |
|---|---|---|---|
| 5,087,605 | 2/1992 | Hedge | 257/35 |
| 5,106,819 | 4/1992 | Takemura | 257/35 |
| 5,389,603 | 2/1995 | Batlogg | 505/120 |

FOREIGN PATENT DOCUMENTS

| | | | |
|---|---|---|---|
| 1-12585 | 1/1989 | Japan | 257/35 |
| 2-87688 | 3/1990 | Japan | 257/35 |
| 2-185077 | 7/1990 | Japan . | |
| 3-50122 | 3/1991 | Japan . | |
| 3-127876 | 5/1991 | Japan | 257/35 |
| 3-196686 | 8/1991 | Japan | 257/35 |
| 3-296283 | 12/1991 | Japan . | |
| 4-105373 | 4/1992 | Japan . | |

OTHER PUBLICATIONS

"Engineering of ultrathin barriers in high $T_c$, trilayer Josephson junctions", M.E. Klausmeier-Brown et. al., Appl. Phys. Lett., 60(22): 2806–2808(1992).

"Fabrication of thin–film–type Josephson junctions using a Bi–Sr–Ca–Cu–O/Bi–Sr–Cu–O/Bi–Sr–Ca–Cu–O structure", K. Mizuno et. al., Appl. Phys. Lett., 56(15):1469–1471(1990).

"All a–axis oriented $YBa_2Cu_3O_{7-y}$–$PrBa_2Cu_3O_{7-z}$–$YBa_2Cu_3O_{7-y}$ Josephson devices operating at 80 K", J.B. Barner et. al., Appl. Phys. Lett., 59(6):742–744(1991).

(List continued on next page.)

*Primary Examiner*—Patrick Ryan
*Assistant Examiner*—P. R. Jewik
*Attorney, Agent, or Firm*—Finnegan, Henderson, Farabow, Garrett & Dunner, L.L.P.

[57] ABSTRACT

A superconducting element is disclosed which comprises a lower superconducting layer, an upper superconducting layer, and an intermediate layer interposed between the lower and upper superconducting layers. The lower and upper superconducting layers are both form of a superconducting cuprate. The intermediate layer is formed of a layered cuprate containing in the crystal structure thereof multiple fluorite blocks represented by the formula:

$$[B]AE_2(RE1_{1-y}RE2_y)_{m+1}Cu_2O_z$$

(wherein [B] stands for a block layer, AE for an alkaline earth element, RE1 for at least one element selected from the group consisting of lanthanide elements and actinoid elements which form ions of valency of larger than 3, RE2 for at least one element selected from the group consisting of lanthanide elements which form ions of valency of 3 and yttrium, m for a number satisfying the expression $m \geq 2$, y for a number satisfying the expression $0 \leq y < 1$, and z for the oxygen content). The multiple fluorite block functions as an insulating layer and allows fabrication of a S/I/S tunnel type junction.

16 Claims, 12 Drawing Sheets

OTHER PUBLICATIONS

Superconducting Transport Properties of Grain Boundaries in $YBa_2Cu_3O_7$ Bicrystals, D. Dimos et al., Physical Review B, 41(7):4038–4049 (1990).

Superconducting Transport Properties of $YBa_2Cu_3O_{7-\delta}$ Grain Boundry Junctions R. Gross et al., Supercond. Sci. Technol 4:S253–S255 (1991).

New Classification Method for Layered Copper Oxide Compounds and Its Application to Design of New High $T_c$ Superconductors, Y. Tokura et al., Japanese Journal of Applied Physics, 29(11):2388–2402 (1990).

Neutron Diffraction Study of The Pb–based Copper Oxide Containing Thick Fluorite blocks: $(Pb,Cu)Sr_2(Ho, Ce)_3Cu_2O_{11+z}$, Wada et al., Physica C, 179:455–460 (1991).

New Tl–based Copper Oxide Containing Double–$MO_2$–unit Fluorite Block: $(Tl,Cu)Sr_2R, Ce)_3Cu_2O_{11}$ (R:Rare Earth Element), Wada et al, Physica C, 175:529–533 (1991).

Structure And Properties of Inorganic Solids, F. Galasso, Pergamon Press, Oxford, 90–95 (1970).

Synthesis and Crystal Structure of $Pb_2Sr_2(Ln, Ce)_nCu_3O_{6+2n+\delta}$ and $Pb(Ba,Sr)_2Ln,Ce)_nCu_3O_{5+2n+\delta}$ (Ln=Y,n=3,4, . . . and $0<\delta<2.0$), Layered Structure Compounds With Multiple Fluorite Layers, Tokiwa et al., Physica C 181:311–319 (1991).

Grant et al., Physica C 185–189 (1991) 2099–2100.

Doss, "Engineer's Guide to High $T_c$ Superconductivity" Wiley & Sons 1989, pp. 150–1553.

Bennett, Concise Chemical & Technical Dictionary Chem Publ, various pages.

Geballe, "Paths to Higher $T_c$ Super," Science vol. 259 Mar. 12, 1993 pp. 1550–1551.

INTERMEDIATE LAYER

MULTIPLE FLUORITE BLOCKS (= INSULATING LAYER)

- ● --- RE1, RE2
- ⊘ --- Pb
- ⊙ --- Sr, Ba
- · --- Cu
- ○ --- O

F I G. 3
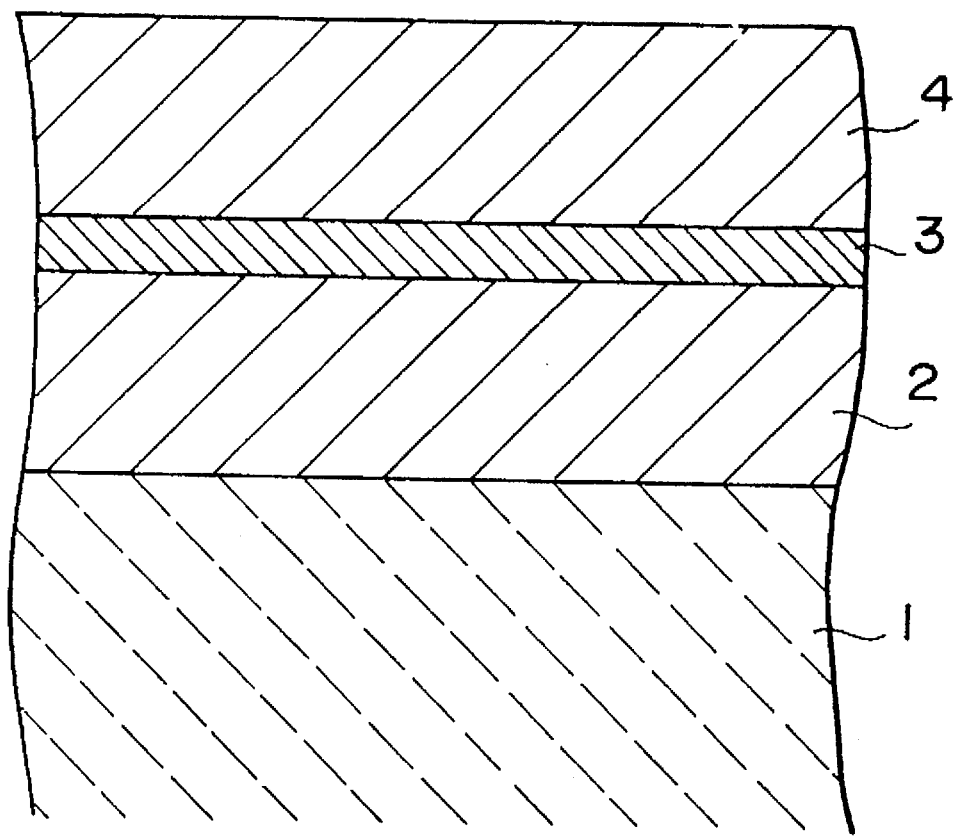

F I G. 12
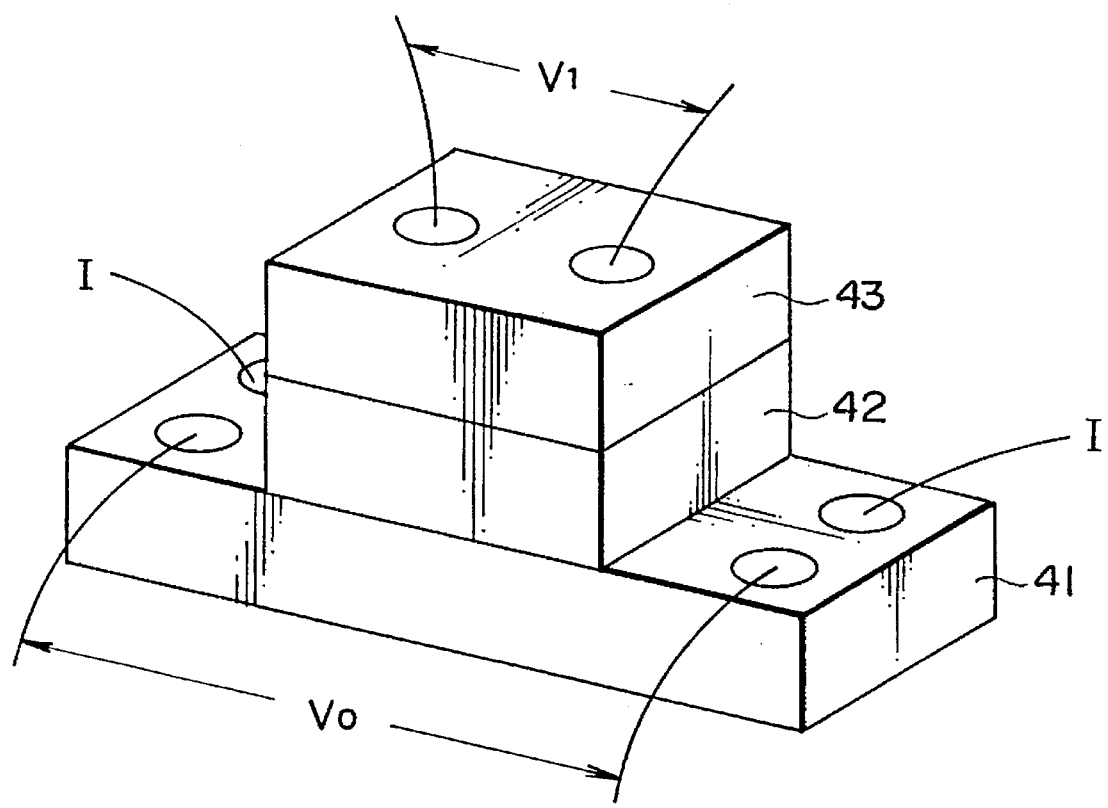

SUPERCONDUCTING ELEMENT HAVING AN INTERMEDIATE LAYER WITH MULTIPLE FLUORITE BLOCKS

This application is a continuation of application Ser. No. 08/076,892, filed Jun. 15, 1993, now abandoned.

BACKGROUND OF THE INVENTION

1. Field of the Invention

This invention pertains to a superconducting element using a high-temperature oxide superconductor and more particularly relates to a superconducting element ideal as a Josephson junction element which is utilized as a memory element, a logical operator, a SQUID, etc.

2. Description of the Related Art

As Josephson junctions using a high-temperature oxide superconductor, such trilayer laminate type constructions as a superconducting thin film/insulating thin film/superconducting thin film structure (S/I/S construction) and a superconducting thin film/normal conducting thin film/superconducting thin film structure (S/N/S construction) have been studied. For the purpose of utilizing a Josephson junction as a switching element or a memory element and also for the purpose of deriving a large output voltage from a Josephson junction element, it is desirable to obtain an ideal S/I/S tunnel type junction. It has been here-tofore difficult, however, to obtain with high repeatability the S/I/S tunnel type junctions using a high-temperature oxide superconductor. For the purpose of obtaining with high repeatability a S/I/S tunnel type junction using a high-temperature oxide superconductor, it is necessary in the first place that the order parameter of superconductivity should be amply developed as far as the interface between the superconducting layer and the insulating layer. It is also necessary in the second place that the insulating layer approximately 2 nm in thickness should be formed without generating a short circuit or a leak of current.

For example, the S/N/S junction which uses a c-axis oriented $Bi_2Sr_2Ca_2Cu_3O_7$ thin film as a superconducting layer and also uses a $Bi_2Sr_2CuO_y$ thin film manifesting no superconductivity as a normal conducting layer has been known. The trilayer laminate type Junction of this kind, however, has the drawback of giving rise to a metamorphic layer in the interfaces of lamination and failing to control this adverse nature. It is further at a disadvantage in that this junction is liable to produce pinholes in the intermediate N layer and, at the same time, the N layer is easily converted into a superconductor by a change in the carrier concentration or composition. Owing to these drawbacks, the S/N/S junction of the structure mentioned above entails a problem of poor repeatability of the manifestation of Josephson characteristics.

Similarly, the S/N/S junction which has a $Bi_2Sr_2CuO_y$ thin film manifesting no superconductivity interposed between two c-axis oriented $Bi_2Sr_2CaCu_2O_y$ superconducting layers is reported by K. Mizuo et al. in Appl. Phys. Lett., Vol. 56, No. 15, pp. 1469 to 1471. Besides, the S/I/S junction which has a long-periodic layered copper oxide compound like $Bi_2Sr_2(Ca,Sr,Bi)_7Cu_8O_{20}$ interposed as an insulating layer between two c-axis oriented $Bi_2Sr_2CaCu_2O_y$ superconducting layers is reported by M. E. Klausmeier-Brown et al. in Appl. Phys. Lett., Vol. 60, No. 22, pp. 2806 to 2808. These trilayer junctions share the disadvantage that Ca and Sr diffuse from the superconducting layer into the intermediate layer of N layer or I layer, convert part of the intermediate layer locally into a superconductor, and tend to induce a leak of super current.

An attempt has been made to fabricate a S/I/S junction by forming a thin film of a simple oxide like $ZrO_2$ or MgO or a thin film of a fluoride as an insulating layer by the sputtering technique or vacuum deposition technique. This trilayer junction, however, has a problem of pinholes in the insulating layer and of unduly low $T_c$ because the oxide superconducting layer is not easily deposited with a fine quality as film. JP-A-2-185,077, for example, discloses a Josephson junction element using fluorite ($CaF_2$) for an insulating layer. This element is not considered to grow the insulating layer in such a manner as to allow lattice matching with the oxide superconductor. This element, therefore, is at a disadvantage in that the superconducting characteristics in and near the interfaces between the upper and lower oxide superconductors and the intervening insulating layer are deteriorated and, moreover, these interfaces are liable to form steps and pinholes. Particularly, this element has the disadvantage that fluorine diffuses in the upper and lower oxide superconducting layers and impairs the superconducting characteristics. JP-A-3-296,283 discloses a Josephson junction which has an insulating layer of an oxide represented by $RE_2O_w$, like $PrO_2$ or $Y_2O_3$ interposed between a pair of $REBa_2Cu_3O_{7-x}$ (wherein RE stands for a rare earth element) superconducting layers. This junction has the disadvantage that the insulating layer is liable to form steps and pinholes because it is not presumed to grow the insulating layer in a layer-by-layer growth.

Further, an attempt has been made to use such Perovskite type oxides as $SrTiO_3$, $PrGaO_3$, $NdGaO_3$, $LaSrGaO_4$, and $BaTiO_3$ for an insulating layer. When such a simple insulating oxide as mentioned above and a copper oxide based superconductor are subjected to heteroepitaxial growth, the following drawbacks are intrinsically encountered. When a copper oxide based superconductor is grown in the form of a thin film, the growth unit is from a block layer to a block layer which both take no part in conduction. In the case of the oxide of $Bi_2Sr_2CaCu_2O_y$, for example, the growth unit is from the Bi-O layer to the Bi-O layer. Then, in the case of the oxide of $YBa_2Cu_3O_7$, the growth unit is from $CuO_\delta$ Chain to the $CuO_{1-\delta}$ Chain. The surface which is formed in consequence of the growth of a lower superconducting electrode of an oxide superconductor consists of a block layer irresponsible for superconductivity. When an intermediate layer is superposed on the surface mentioned above and an upper superconducting electrode is then grown, it is likewise a block layer irresponsible for superconductivity that occurs directly above the intermediate layer. As a result, a normal conducting layer which is neither an insulator nor a superconductor is inevitably formed in the interface between the $CuO_2$ layer responsible for superconductivity and an insulating oxide (intermediate layer). The attempt at fabricating a S/I/S junction in this case, therefore, is at a disadvantage in intrinsically giving rise to a S/N/I/N/S junction. This attempt, accordingly, fails to obtain a S/I/S junction which possesses ideal characteristic properties such that the order parameter of superconductivity is fully developed as far as the boundary of an insulating layer.

As a Josephson junction of trilayer laminate structure by epitaxial growth, the junction of a $YBa_2Cu_3O_7$/$PrBa_2Cu_3O_{7-\delta}$/$YBa_2Cu_3O_7$ structure is being trially fabricated. This case is reported by J. B. Barner et al. in Appl. Phys. Lett., Vol. 59, No. 6, pp. 742 to 744. This junction has the disadvantage that the intermediate layer is easily converted into a conductor or a superconductor by mutual diffusion of Y and Pr.

Further, JP-A-4-105,373 discloses a superconducting element in which $CuO_5$ pyramids are opposed to each other through the medium of a single fluorite-structural block ($Ln_2O_2$) and a substance adjoining the apexes of the pyramids and having alternately superposed a part formed of an alkaline earth element and a part formed of oxides of Pb and Cu is used for an N layer or an I layer. This superconducting element uses the compound which contains a single fluorite-structural block. For the purpose of enabling this compound to function as an N layer or an I layer, therefore, the intermediate layer must be given a thickness of not less than two unit cells (typically a thickness of 50 nm). The compound containing the single fluorite-structural block is easily converted into a superconductor by a change in composition or by diffusion of an element from the superconducting layer. The thickness of the single fluorite-structural block measured as the distance between the $CuO_2$ planes is approximately 0.6 nm, a value not appreciably large as compared with the coherence length in the direction of the C axis. The superconducting element under discussion, therefore, is at a disadvantage in respect that when this compound is converted into a superconductor, a superconducting linkage occurs also in the direction of C axis and the leak of current occurs readily.

Successful fabrication of a S/N/S Josephson junction of fine quality with high repeatability by the use of grain boundaries of a high-temperature oxide superconductor is reported by D. Dimos, P. Chaudhari, and J. Mannhart in Physical Review B., Vol. 41, No. 7, pp. 4038 to 4049 (1990). A similar Josephson junction is reported by P. Gross et al. in Supercond. Sci. Technol., Vol. 4, pp. S253 to 255 (1991). These junctions make use of the grain boundaries of a $YBa_2Cu_3O_7$ thin film which is formed on the twin boundaries of a bicrystal substrate.

These grain-boundary Josephson junctions, however, entail the following drawbacks. Firstly, since the bicrystal substrate is fabricated by a method such as joining two crystals face to face, the process for preparing such substrates is complicated. Secondly, since the junctions are formed exclusively on the twin boundaries of the bicrystal substrate, they cannot be formed at a desired place on the substrates. Thirdly, since the junctions are obtained exclusively in a planar pattern, laminate type junctions which allow a superconducting current to flow in a direction perpendicular to the surfaces of substrates cannot be fabricated. Fourthly, since the Josephson junctions are weak link junctions, they cannot be given as large a $I_cR_n$ product as is normally possessed by a S/I/S junction.

As described above, the conventional laminate type Josephson junctions have the disadvantage of readily inducing the adverse phenomenon of current leakage because they have insufficiently matched interfaces between the oxide superconducting layers and the intermediate layers and they are liable to sustain such defects as steps and pinholes in the intermediate layers. They are further at a disadvantage in suffering the intermediate layers to be easily converted into conductors or superconductors as by a change in composition. Owing to these drawbacks, the conventional laminate type Josephson junctions have been unable to acquire ideal Josephson characteristics with satisfactory repeatability. In contrast, the grain-boundary Josephson junctions, though superior to the reported laminate type junctions in terms of characteristic properties, suffer from such drawbacks as complexity of the process of fabrication, many restrictions imposed on the manner and location of the formation, and inferior practical utility.

In the circumstances, an earnest desire has been expressed to perfect a laminate type Josephson junction which is vested with high practical utility and enabled to manifest improved Josephson characteristics with enhanced repeatability by eliminating such drawbacks on structure and material as mentioned above.

SUMMARY OF THE INVENTION

An object of this invention, therefore, is to provide a laminate type superconducting element which ensures stabilization of structure and quality of an insulating layer and, at the same time, enhances the matching property of the interfaces between the superposed layers. Another object of this invention is to provide a superconducting element which is enabled to acquire ideal Josephson characteristics with enhanced repeatability by precluding the possible occurrence of a short circuit or a leak of current in the insulating layer and, at the same time, causing the order parameter of superconductivity to develop fully as far as the interface between the superconducting layer and the insulating layer.

The superconducting element of this invention comprises a lower superconducting layer formed substantially of layered copper oxide compounds, an intermediate layer superposed on the lower superconducting layer and formed substantially of a layered copper oxide containing multiple fluorite-structural block in the crystal structure thereof, and an upper superconducting layer superposed on the intermediate layer and formed substantially of layered copper oxide compounds.

The layered copper oxide compounds to be used in the superconducting element of this invention are only required to be capable of manifesting the state of superconductivity. It is not specifically discriminated on account of the material. These layered copper oxide compounds are favorably used when it is capable of readily growing in the form of layer. The superconducting cuprate which answer the description given above include Bi-containing layered copper oxide compounds, Tl-containing layered copper oxide compounds, Pb-containing layered copper oxide compounds, and rare earth-containing layered copper oxide compounds, for example. As concrete examples of these layered copper oxide compounds, those of the compositions substantially represented by the following chemical formulas may be cited.

$Bi_2Sr_2Ca_{n-1}Cu_nO_z$ (n=1 to 4)      (1)

$Tl_2Ba_2Ca_{n-1}Cu_nO_z$ (n=1 to 4)      (2)

$TlBa_2Ca_{n-1}Cu_nO_z$ (n=1 to 4)      (3)

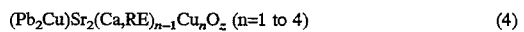
$(Pb_2Cu)Sr_2(Ca,RE)_{n-1}Cu_nO_z$ (n=1 to 4)      (4)

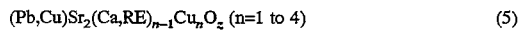
$(Pb,Cu)Sr_2(Ca,RE)_{n-1}Cu_nO_z$ (n=1 to 4)      (5)

$REBa_2Cu_3O_{7+\delta}$      (6)

(wherein RE stands for a rare earth element and z for the oxygen content).

Regarding the form of the copper oxide superconducting layer, the effect of this invention cannot be amply manifested when the form is such that the c axis is oriented in a random direction. Thus, the c axis is desired to be oriented perpendicularly to the surface of the substrate. The state of this orientation can be obtained by a well-controlled thin film-forming technique.

In the layered copper oxide compounds under discussion, the $CuO_2$ planes which are commonly contained in the crystal structure are responsible for electric conduction and, therefore, for superconductivity. The part which is interposed between these $CuO_2$ planes is generally referred to as a block layer [refer to Tokura and Arima: Jpn. J. Appl. Phys., Vol. 29, p. 2388 to (1990)]. The oxide superconductors of $T_c$ of 40K or more which have been discovered to date can be invariably regarded as comprising block layers of one or two kinds and $CuO_2$ planes interposed one each between the block layers. The oxide superconductors represented by the aforementioned formulas (1) to (6) contain $[Bi_2O_2]^{2+}$, $[Tl_2O_2]^{2+}$, $[TlO]^{1+}$, $[PbO-Cu-PbO]^{1+}$, $[(Pb,Cu)O]^{1+}$, $CuO_{1-\delta}$ Chain, etc. respectively as the block layer. It is a safe conclusion that the copper oxide based superconductors are capable of growing in the form of layer because they contain such block layers (hereinafter expressed as [B]). Particularly in $[Bi_2O_2]^{2+}$ and $[PbO-Cu-PbO]^{1+}$, since $Bi^{3+}$ and $Pb^{2+}$ have $6s^2$ lone electron-pair and have strongly polarized ions, they form anisotropy of bond, tend to form a layer crystal structure, and allow layered growth of crystals easily. As another block layer, $(Ce,RE)O_2$ (a representative fluorite-structural block; RE standing for a rare earth element) has been known.

The block layers mentioned above are generally incapable of being multiply superposed without having $CuO_2$ planes interposed therebetween. The inventors have found that the aforementioned fluorite-structural blocks are exceptions and, by suitable control of film-forming conditions and suitable selection of film-forming sources, these fluorite-structural blocks can be exclusively superposed (multiple fluorite-structural blocks) and, by selection of the number of such superposed layers, the superposed fluorite-structural blocks can be made to function as an insulating layer.

The superconducting element of this invention uses a layered copper oxide compound containing such multiple fluorite blocks as mentioned above for an intermediate layer. Josephson junctions of ideal quality, for example, can be obtained by causing such multiple fluorite-structural blocks to grow in the form of a layer of a desired thickness.

A layered copper oxide compound containing in the crystal structure thereof a part having fluorite-structural blocks superposed in two or three layers has been already synthesized in the form of a sintered bulk. T. Wada et al., for example, report in Physica C., Vol. 179, pp. 455 to 460 (1991) their successful synthesis of a polycrystalline bulk of $(Pb,Cu)Sr_2(HO,Ce)_3Cu_2-O_{11+\delta}$ containing fluorite-structural blocks superposed in two layers. T. Wada et al. also report in Physica C., Vol. 175, pp. 529 to 533 (1991) their successful synthesis of a polycrystalline bulk of $(Tl,Cu)Sr_2(RE,Ce)_3Cu_2O_{11+\delta}$. A. Tokiwa et al. report in Physica C., Vol. 181, pp. 311 to 319 (1991) their successful synthesis of a polycrystalline bulk of $Pb_2Sr_2(Y,Ce)_nCu_3O_{6+2n+\delta}$ (n=3, 4) and their observation of the occurrence of intergrowth corresponding to n=5, 6, 7 in the sample of this bulk under a transmission electron microscope. A. Tokiwa et al. simultaneously report their successful synthesis of a polycrystalline bulk of $Pb(Ba,Sr)_2(Y,Ce)_3Cu_3O_{11+\delta}$.

These reports invariably concern synthesis in the form of bulk. This invention has realized fabrication of a crystal structure hardly attainable in bulk by using an oxide superconductor or the layered copper oxide compound possessing a layered crystal structure and resorting to layer growth of thin films.

The layered copper oxide compound to be used for an intermediate layer in this invention (intermediate layer substance) contains in the crystal structure thereof a multiple layer (m layer) fluorite-structural blocks represented by the following formula.

$$[(RE1_{1-y}RE2_y)O_2]_{m+1} \tag{7}$$

(wherein RE1 stands for at least one element selected from the group consisting of lanthanoide elements and actinoid elements which are capable of forming ions of valency of larger than 3, RE2 for at least one element selected from the group consisting of lanthanoide elements which are capable of forming ions of valency of 3 and yttrium, and y for a number satisfying the expression $0 \leq y < 1$. In other words, the intermediate layer in the superconducting element of this invention basically is produced by forming multiple the (m layer) fluorite-structural blocks in a thickness which is the product of the unit of 0.27 nm multiplied by m and adapting this block to function as an insulating layer incapable of passing an ohmic current in the direction of film thickness, for example.

As another block layer [B] of the aforementioned intermediate layer substance in the layered copper oxide compound, those blocks which are similar to the block layer contained in the copper oxide superconducting layer (such as, for example, $[Bi_2O_2]^{2+}$, $[Tl_2O_2]^{2+}$, $[TlO]^{1+}$, $[PbO-CuPbO]^{1+}$, $[(Pb,Cu)O]^{1+}$, and $CuO_\delta$ Chain) may be cited. It is particularly desirable that this block is identical with the block layer contained in the copper oxide superconducting layer being used herein. When the block layers are identical, the epitaxial growth can be effected with ease and, at the same time, the number of film-forming sources involved in the process of production (such as, for example, the number of Knudsen cells in the molecular beam epitaxy technique) can be decreased.

As a representative chemical formula of the layered copper oxide compound destined to form an intermediate layer, the following formula may be cited:

$$[B]AE_2(RE1_{1-y}RE2_y)_{m+1}Cu_2O_z \tag{8}$$

(wherein [B] stands for a block layer, AE for an alkaline earth element, RE1 for at least one element selected from the group consisting of lanthanide elements and actinoid elements which are capable of forming ions of valency of larger than 3, RE2 for at least one element selected from the group consisting of lanthanide elements which are capable of forming ions of valency of 3 and yttrium, m for a number satisfying the expression $m \geq 2$, y for a number satisfying the expression $0 \leq y < 1$, and z for the oxygen content). The value of m must exceed 2 because the compound satisfying m=1 possibly undergoes conversion, depending on the carrier concentration, into a superconductor and gives rise to couple of superconductivity in the direction of c axis. All the alkaline earth elements are usable as AE. In due consideration of ionic radius, however, Sr or Ba proves to be a wise choice. One representative example of one unit part of the intermediate layer substance (the part of the crystal structure extending from [B] block layer to adjacent [B] block layer, is regarded as one unit) is illustrated in FIG. 1. The intermediate layer substance shown in FIG. 1 uses $[PbO-Cu-PbO]^{1+}$ as [B] and contains an 8 layer fluorite-structural block.

The multiple fluorite block mentioned above stably functions as an insulating layer. The intermediate layer in the present invention, therefore, is enabled to acquire the effect inherent therein by accumulating the layered copper oxide compound containing the multiple fluorite-structural block to a thickness of one unit. It is also permissible to use layered cuprates as superposed in a thickness in the approximate range of 2 to 12 units.

Though the layered copper oxide compound containing the multiple fluorite-structural block is basically such that the multiple fluorite block thereof functions as an insulating layer as described above, the layered copper oxide compound as a whole (one unit) may be adapted to function as an insulating layer. It is also allowable to utilize the multiple fluorite-structural block alone as an insulating layer and maintain the upper and lower $CuO_2$ planes thereof in an electrically active state, i.e. in a conducting or superconducting state. When a Josephson junction element is to be fabricated with the superconducting element of this invention, the pattern in which the layered copper oxide compound as one unit part constitutes itself as an intermediate layer and the multiple fluorite-structural block alone as an insulating layer, i.e. the pattern in which the insulating layer does not contain a $CuO_2$ plane, is optimum. This is because the $CuO_2$ planes are liable to assume conductivity in consequence of a slight change in composition and have the possibility of degrading the function as an insulating layer. When the multiple fluorite-structural block alone is utilized as the insulating layer and the upper and lower $CuO_2$ planes thereof are allowed to maintain the state of exhibiting superconductivity, the order parameter of superconductivity is amply developed as far as the interfaces between the superconducting layers and the insulating layer as described specifically hereinbelow. Even from this point of view, the pattern having the intermediate layer formed of one unit part of the layered copper oxide compound may well be called desirable for the sake of formation of the Josephson junction. In the case of the Josephson junction of S/I/S structure, the thickness of the insulating layer (I layer) is desired to be in the approximate range of 1 to 4 nm. In this case, the thickness of the multiple fluorite-structural block measured as the distance between the adjacent $CuO_2$ planes is 0.595+0.27 (m−1) nm. When the insulating layer of the S/I/S junction is formed of one unit of the layered copper oxide compound, therefore, the thickness of the multiple layer fluorite-structural type block is desired to be in the approximate range of 0.8 to 3.5 nm (m=2 to 12). The value of m is more desirably in the approximate range of 4 to 10 and most desirably in the neighborhood of 7.

The multiple fluorite-structural block mentioned above may be regarded as a structure having planes solely of cations and planes solely of oxygen atoms alternately stacked between the $CuO_2$ planes. As indicated by the formula (7) mentioned above, the cation sites (Al sites) within the multiple fluorite-structural block are occupied by RE1 and RE2. RE1's are lanthanide elements and actinoid elements such as, for example, $Ce^{4+}$, $Pr^{4+}$, $Tb^{4+}$, $Th^{4+}$, $Pa^{4+}$, and $U^{4+}$ which are capable of forming ions of valency of larger than 3. In due consideration of the ionic radius of these ions, $Ce^{4+}$ proves to be the most desirable choice, followed by $U^{4+}$, $Pr^{4+}$, and $Th^{4+}$ as arranged in the decreasing order of preference. This is because the lattice matching between the multiple fluorite-structural block and the $CuO_2$ planes located on and beneath the block is improved, the intermediate layer compound is chemically stabilized, and the carrier on the $CuO_2$ planes contained in the intermediate layer is enabled to defy localization to an increased extent. The RE1's are necessary for chemically stable formation of the multiple fluorite-structural block.

The RE2's are elements which are capable of forming ions of valency of 3. All the lanthanide elements (La, Pr, Nd, Sm, Eu, Gd, Tb, Dy, Ho, Er, Tm, Yb, and Lu) and Y are usable for the E2's. Since $La^{3+}$ specifically likes a 9 to 10 coordination while the other ions like an 8 coordination in the layered copper oxide compound, it is not very desirable to use $La^{3+}$. RE2's are not always required for the formation of the multiple fluorite-structural block. Thus, y=0 is allowable. As described specifically afterward, they are required for the purpose of enabling the order parameter of superconductivity to be amply developed as far as the interfaces between the superconducting layers and the insulating layer. For the purpose of chemically stabilizing the multiple fluorite block, the value of y is desired to be not more than 0.6.

Incidentally, the fluorite type crystal structure is stable when the average ionic radius R (Al) of the Al sites (8 coordination) is not less than 0.73 times and not more than 0.84 times respectively the ionic radius R (0) of oxygen. If the ratio of R (Al)/R (0) is less than 0.73, the fluorite type crystal structure tends to like the rutile structure having oxygen atoms in a 6 coordination around cations or the C rare earth structure [F. S. Galasso, "Structure and Properties of Inorganic solids (Pergamon, Oxford, 1970)]. In this invention, therefore, it is desirable to select the kinds of RE1 and RE2 and the ratio of their amounts so that the average ionic radius R (Al) may fall in the range of 0.0991 to 0.11592 nm (most desirably 0.10074 to 0.108 nm) with respect to a certain plane of cations. When $Ce^{4+}$, $Pr^{4+}$, $Tb^{4+}$, $Th^{4+}$, $Pa^{4+}$, and $U^{4+}$ happen to occupy not less than 70% of the Al sites, however, the range mentioned above needs not be strictly observed in the first place because these dioxides assume the fluorite type structure. When the RE2 happens to have a relatively small ionic radius (as in $Er^{3+}$, for example) and the ratio of the amount thereof to that of RE1 exceeds 2, the oxygen atoms in the upper and lower faces are regularly deficient and possibly compelled to assume partly the same crystal structure (called a C rare earth structure) as that of $Y_2O_3$. The multiple fluorite-structural block in the intermediate layer substance of this invention may partly contain the aforementioned C rare earth structure.

The mixing ratio y of the RE1 element and the RE2 element in the formula (7) and the formula (8) mentioned above is desired to be in a range which is fixed in due consideration of the carrier concentration p. The term "carrier concentration p" as used herein refers to the excess charge p per $[CuO]^{+p}$ which is determined from the mixing ratio of cations and anions based on the conditions of charge neutrality. When the whole intermediate layer is adapted for a semiconductor or an insulator, y must be selected so as to satisfy p=0. When the multiple fluorite-structural block is given an ample thickness and enabled to function stably as an insulating layer and, at the same time, the $CuO_2$ planes included in the intermediate layer are desired to remain in an electrically active (namely superconducting) state, y is desired to be selected so as to satisfy p=0.15 to 0.25. When $(Pb_2Cu)Sr_2(Ce_{1-y}Eu_y)_{m+1}Cu_2O_{8+2m-\delta}$ is used as the material for the formation of the intermediate layer, for example, y is set in the neighborhood of (1+2 δ)/(m+1) where the whole intermediate layer is adapted for a semiconductor or an insulator or y is set in the neighborhood of (1.4+2 δ)/(m+1) where the $CuO_2$ planes included in the intermediate layer are desired to remain in an electrically active state.

For the purpose of obtaining a S/I/S tunnel junction with a high-temperature oxide superconductor, it is necessary that the order parameter of superconductivity should have been developed amply as far as the interfaces between the superconducting layers and the insulating layer. For the sake of this ample development of the order parameter, it is desirable that the $CuO_2$ planes included in the intermediate layer are retained in an electrically active state, i.e. in a conductive state or super-conductive state. Specifically, the $CuO_2$ planes included in the intermediate layer are desired to be doped with a carrier. It is, therefore, desirable to select y so as to satisfy p=0.15 to 0.25 and, at the same time, localize a trivalent RE2 near the $CuO_2$ planes within the multiple fluorite block. To date, the practice of synthesizing the layered copper oxide compound containing the multiple fluorite-structural block with a polycrystalline bulk has been in vogue. The oxide, however, fails to exhibit superconductivity and assumes the quality of increasing electric resistance proportionately as the temperature falls. Successful synthesis of a series of compounds containing multiple fluorite-structural blocks such as, for example, $Pb_2Sr_2Y_1Ce_mCu_3O_{8+2m-\delta}$: m=1, 2, 3 with a polycrystalline bulk is reported by A. Tokiwa et al. in Physica C., 181, 311 (1991). This report contains a mention to the effect that the resistivity increases according as the value of m increases. The present inventors have found that the resistivity is increased because $Ce^{4+}$ and $Y^{3+}$ are randomly distributed within the multiple fluorite-structural block and, as a consequence, the oxygen deficiency $\delta$ is suffered to grow proportionately as the value of m increases.

The measure shown below is effective in decreasing the lattice defect in the form of oxygen deficiency and doping the $CuO_2$ planes efficiently with a carrier without appreciably exalting the value of y (y in the range in which the multiple layer fluorite-structural type block is chemically stable). This effective measure resides in localizing a trivalent RE2 at the Al sites adjoining the $CuO_2$ planes and causing a RE1 of valency of greater than 3 to enter the neighborhood of the center of the multiple fluorite-structural block as much as possible. As a result of this measure, the oxygen deficiency occurs within the multiple fluorite-structural block only with difficulty and the $CuO_2$ planes are effectively doped with a carrier. Further, for the purpose of enabling the $CuO_2$ planes included in the intermediate layer to remain in a conductive state or a superconducting state, it is desirable to select the kinds of RE1 and RE1 and the ratio of their amounts so that the average ionic radius of the Al sites adjoining the $CuO_2$ planes may fall in the range of 0.1007 to 0.108 nm (most desirably 0.102 to 0.106 nm).

For the purpose of effectively doping the $CuO_2$ planes of the intermediate layer, the other block layer [B] has desirable conditions to fulfill. To be specific, the charge of [B] is desired to be as small as permissible. As concrete examples of [B], $[TlO]^{1+}$, $[PbO-Cu-PbO]^{1+}$, $[(Pb,Cu)O]^{1+}$, $[(Tl_{0.5}Cu_{0.5})O]^{0.5+}$, and $[(Tl,Pb)O]^{0.5+\ to\ 1.5+}$ are more desirable than $[Bi_2O_2]^{2+}$ and $[Tl_2O_2]^{2+}$.

By fulfilling the conditions mentioned above, the order parameter of superconductivity is enabled to develop amply as far as the interfaces between the superconducting layer and the insulating layer. As a result, an S/I/S tunnel type junction excelling in characteristics and repeatability can be obtained. The expression "order parameter ($\psi$) of superconductivity" as used herein refers to the degree with which the relevant electrons are locally enabled to assume superconductivity and it is expressed by the following formula.

Order parameter ($\psi$)=(Superconducting electron density)$^2$=(Amplitude of macroscopic wave function of superconductivity)

The state in which the order parameter of superconductivity is fully developed as far as the interface between the superconducting layer (S) and the insulating layer (I) is illustrated in FIG. 2 (a). In contrast, FIG. 2 (b) illustrates the state in which the order parameter of superconductivity is not developed amply. As illustrated in FIG. 2 (a), an ideal superconduction gap A is obtained owing to the fact that the order parameter of superconductivity is amply developed as far as the S/I interface.

In the superconducting element of this invention, the multiple-layered (m layer) fluorite-structural block in the layered copper oxide compound which is used as an intermediate layer is enabled to function stably as an insulating layer by setting the value of m at or above 2. Also by a change such as in mutual diffusion, carrier concentration, or composition, the multiple-layered (m layer) fluorite-structural block can be easily converted into a conductor or a superconductor. Multiple layer fluorite-structural blocks which contain no $CuO_2$ planes cannot be converted into a conductor even when Cu, Pb, Bi, AE, etc. are partially incorporated therein by diffusion or a carrier is injected therein. Thus, an S/I/S junction excelling in stability can be obtained.

Since the layered copper oxide compound containing the multiple fluorite-structural block layer excels in the ability to effect lattice matching with the layered copper oxide compounds, the intermediate layer and the upper and lower oxide superconducting layers are severally enabled to attain epitaxial growth. By particularly using an intermediate layer containing a block layer [B] identical with the copper oxide superconducting layer, this intermediate layer is enabled to attain epitaxial growth as ideally matched with the upper and lower superconducting layer. As a result, otherwise possible formation of a converted layer in the neighborhood of the interface between the superconducting layers and the intermediate layer occurs only with difficulty and the order parameter of superconduction can be ideally maintained as far as the interface of the insulating layer. Further, by suitably selecting the ionic radii of RE1 and RE2 and the ratio of their amounts, by localizing the sites occupied by a trivalent RE2 in the neighborhood of the $CuO_2$ planes, and by selecting [B] of a small charge, for example, the order parameter of superconductivity can be ideally maintained as far as the $CuO_2$ planes within the intermediate layer which constitutes itself the interface between the superconducting layers and the insulating layer.

The intermediate layer is enabled to attain layer growth with exalted easiness by including therein the block layer [B]. The multiple fluorite-structural block layer likewise attains easy layer growth because it possesses a crystal structure in which cation layers and $O^{2-}$ layers of (RE1, RE2) are alternately superposed. By epitaxially growing a substance which attains easy layer growth as mentioned above, a laminate film sparingly entailing steps or defects can be obtained and a Josephson junction allowing no easy occurrence of a short circuit can be produced in spite of the small thickness of the insulating layer. Further, since the multiple fluorite-structural block can be fabricated in a desired thickness which is a multiple of the unit of 0.27 nm, the thickness of the insulating barrier can be varied so as to suit the particular use for which the product is intended.

In accordance with this invention, an S/I/S tunnel type Josephson junction vested with ideal characteristic properties can be produced firstly because the order parameter of superconduction is fully developed as far as the interface between the superconducting layers and the insulating layer and secondly because the insulating layer allows no easy occurrence of a short circuit. The Josephson junction contemplated by this invention can be utilized for superconducting three-terminal elements. As one concrete example of such elements, a superconducting three-terminal element of the S/I/S/I/S configuration has been advocated. This is a product obtained by superposing two S/I/S junctions. The three-terminal element of this kind can be realized by superposing two S/I/S tunnel type Josephson junctions which each result from superposing thin films of this invention in three layers. A superconducting base transistor can be realized by superposing a semiconducting layer on (or beneath) the S/I/S tunnel type Josephson junction obtained by superposing the thin films of this invention in three layers. Then, a quasi-particle injection type three-terminal element of S/I/S/N/S configuration can be realized by superposing an S/N/S on (or beneath) the S/I/S tunnel type Josephson junction obtained by superposing the thin films of this invention in three layers. The superconducting element of this invention can be utilized for a DC transformer, for example. Further, the intermediate layer substance of this invention can be used as an insulating layer for the separation of adjacent elements by setting the value of m at or above 100.

BRIEF DESCRIPTION OF THE DRAWINGS

FIG. 3 is a cross section illustrating in the form of a model the essential structure of a superconducting element as one embodiment of this invention.

FIG. 12 is a diagram illustrating in the form of a model the structure of a DC transformer as one embodiment of this invention.

DESCRIPTION OF THE PREFERRED EMBODIMENTS

Figure 1:
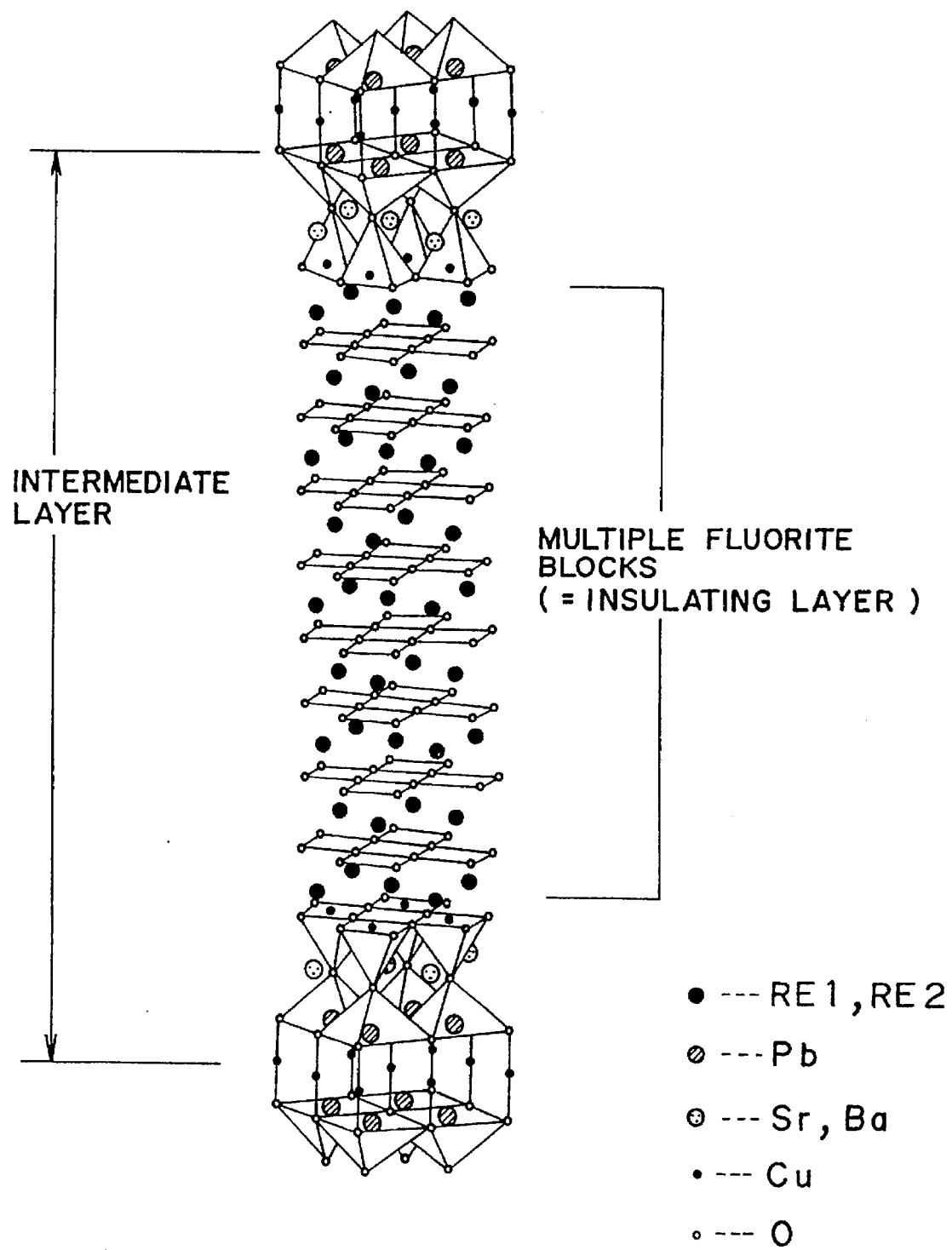
FIG. 1 is a diagram for illustrating in the form of a model one example crystal structure of an intermediate layer substance in a superconducting element of this invention.
Figure 2A:
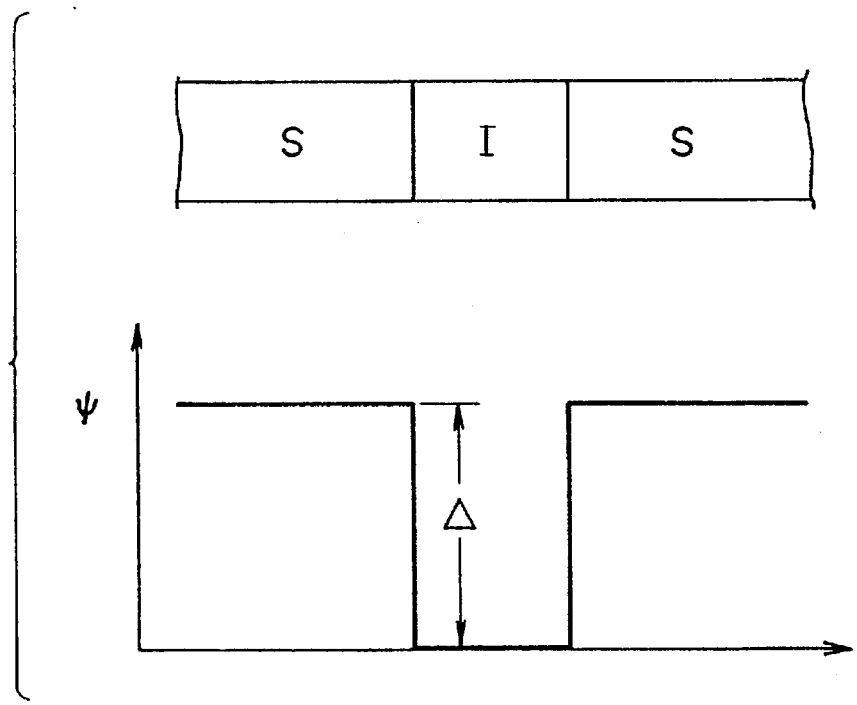
FIGS. 2(a) and 2(b) are diagrams for aiding in illustrating the order parameter of superconductivity in a S/I/S junction.
Figure 2B:
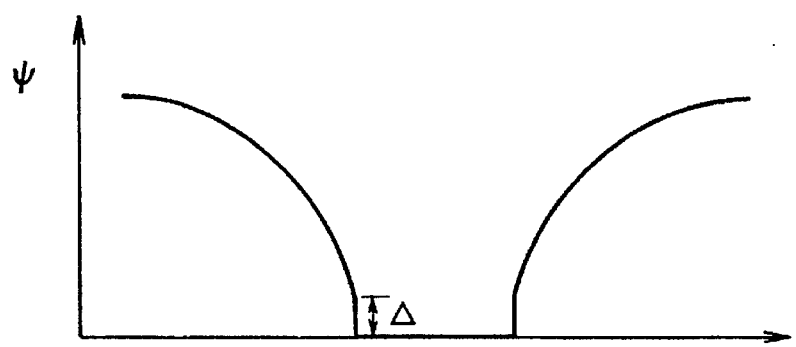

Now, this invention will be described more specifically below with reference to working examples.

FIG. 3 is a cross section illustrating in the form of a model the essential structure of a superconducting element as one embodiment of this invention. In this diagram, 1 stands for a substrate made of a $SrTiO_3$ single crystal, for example. On this substrate 1, a copper oxide superconducting layer such as, for example, an oxide superconducting layer represented substantially by the formulas (1) to (6) mentioned above in which the c axes of crystals are arranged perpendicularly to the surface of the substrate is superposed as a lower superconducting layer 2. On this lower oxide superconducting layer 2, a layered copper oxide compound layer including multiple fluorite-structural blocks as substantially represented by the formula (8) mentioned above is superposed as an intermediate layer 3. Further, on this intermediate layer 3, a similar copper oxide superconducting layer is superposed as an upper superconducting layer 4. With these layers 2, 3, and 4, a three-layer laminate structure is formed.

Figure 4:
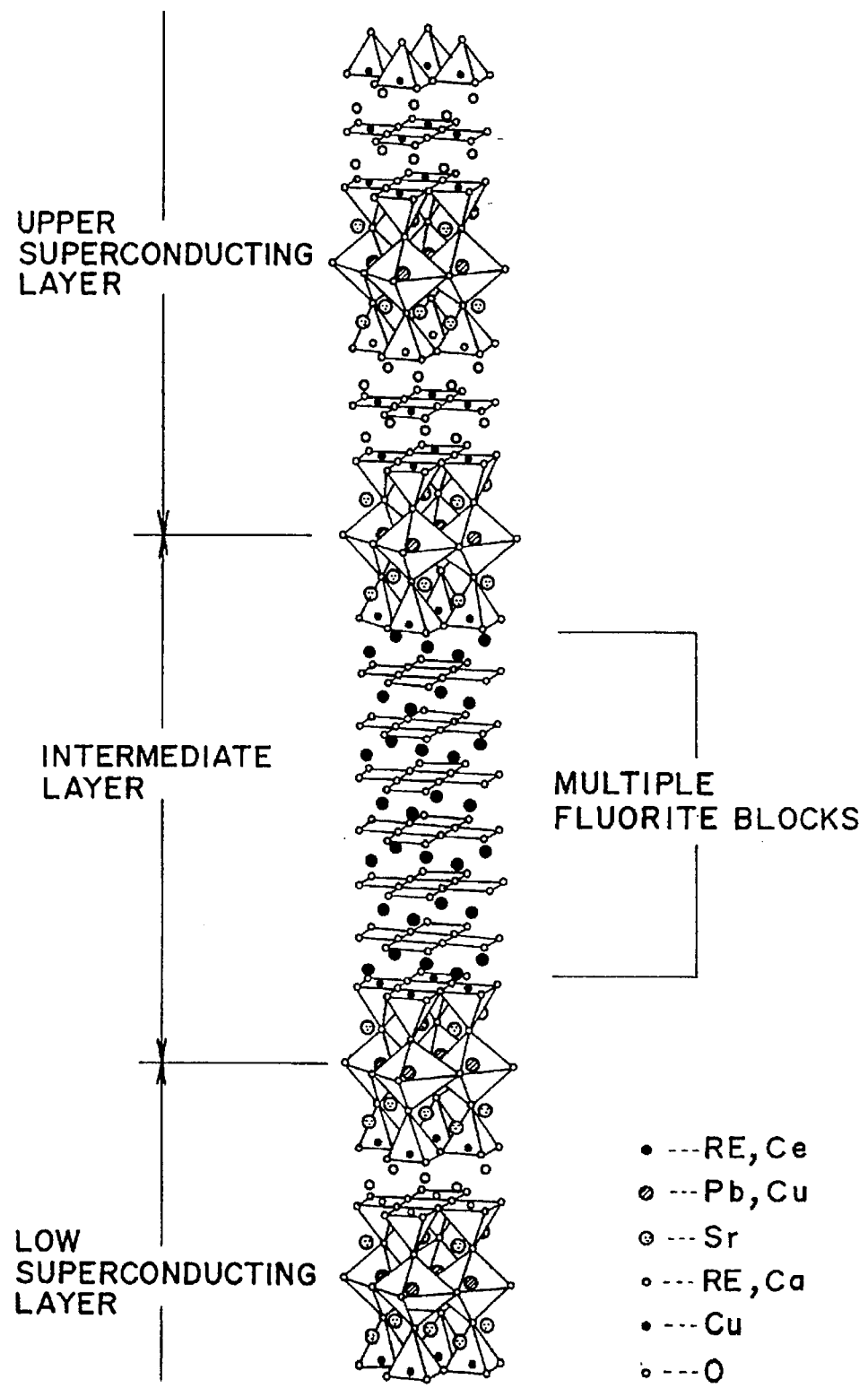
FIG. 4 is a diagram illustrating in the form of a model a three-layer laminate structure of a superconducting element as one embodiment of this invention from the viewpoint of crystal structure.

FIG. 4 is a diagram for illustrating one example of the three-layer laminate structure of the superconducting element mentioned above from the viewpoint of crystal structure. In FIG. 4, oxygen ions are interconnected with solid lines to facilitate comprehension of the coordination of oxygen ions. FIG. 4 depicts a state in which a $(Pb_{0.65}Cu_{0.35})Sr_2(Ca_{0.5}Dy_{0.5})CuO_{7-\delta}$ superconductor (superconduction transition temperature, T=80K) is first grown as a lower superconducting layer 2 on a substrate 1, then a $(Pb_{0.65}Cu_{0.35})Sr_2(Ce,Eu)_7Cu_2O_z$ compound containing a six layer fluorite-structural block is grown as an intermediate layer 3 on the layer 2, and a $(Pb_{0.65}Cu_{0.35})Sr_2(Ca_{0.76}Dy_{0.24})_2Cu_3O_{9-\delta}$ superconductor ($T_c$=90K) is grown further thereon as an upper superconducting layer 4. As illustrated in this diagram, the multiple fluorite-structural block contained in the layered copper oxide compound as the intermediate layer 3 possess a crystal structure in which cation layers and $O^{2-}$ layers of (RE1, RE2) (specifically Ce, RE) are alternately superposed. The upper superconducting layer 4 is an oxide superconductor which contains three $CuO_2$ planes within the unit part unlike a bulk compounds. This oxide superconductor is never attained unless by the molecular beam epitaxy technique. In the three-layer laminate structure illustrated in FIG. 4, the three layers enjoy ideal lattice matching and, therefore, are allowed to attain epitaxial growth in the form of superposed layers.

Now, a concrete example of the formation of a thin film for the fabrication of the superconducting element of the structure mentioned above and the results of evaluation of the produced thin film will be described below.

Figure 5:
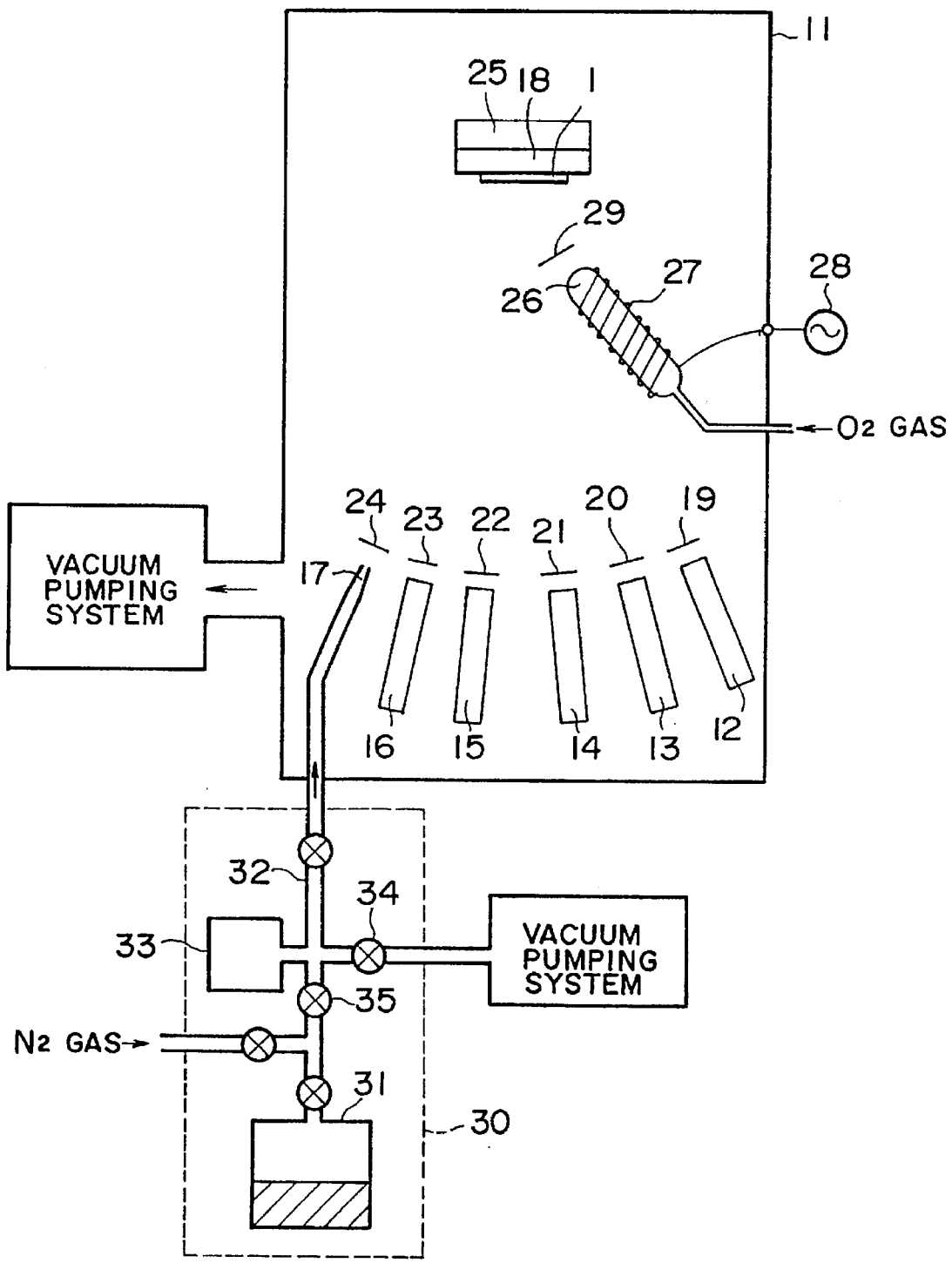
FIG. 5 is a diagram illustrating in the form of a model the structure of a film-forming device used in working examples of this invention.

FIG. 5 is a diagram illustrating in the form of a model the structure of a film-forming device using molecular beam epitaxy and operated for the formation of the thin film mentioned above. In the diagram, 11 stands for a film-forming chamber. Inside this film-forming chamber 11, relevant vapor sources such as, for example, Knudsen cells 12, 13, 14, 15, and 16 for holding Pb, Sr, Ca, RE, and Cu are laid out. Besides, a gas source nozzle 17 is disposed. The Knudsen cells 12, 13, 14, 15, and 16 and the gas source nozzle 17 are severally fitted with heaters. They are so arranged as to evaporate respective metallic elements or gases containing such metallic elements toward the substrate 1 which is set in place on a substrate holder 18. The Knudsen cells 12, 13, 14, 15, and 16 and the gas source nozzle 17 are respectively provided in front thereof with shutters 19, 20, 21, 22, 23, and 24 which are adapted to stop supply of the relevant elements to the substrate. The substrate holder 18 is heated by means of a substrate heater 25 which is disposed behind the holder 18.

Inside the film-forming chamber 11, an oxygen gas inlet tube 26 made of quartz is set in place. A coil 27 is helically wound round the oxygen gas inlet tube 26. The electric power supplied from a radio frequency power source 28 is used for generating an oxygen plasma inside the oxygen gas inlet tube 26 and projecting the active oxygen in the direction of the substrate 1 set in place on the substrate holder 18. In the diagram, 29 stands for a shutter which is used when the active oxygen is directly projected on the substrate 1. Normally, this shutter is kept open.

In this embodiment, the device is so constructed as to supply a RE1 element such as, for example, Ce which is indispensable for the formation of multiple fluorite-structural blocks with the aid of an organic metal gas source. For the supply of Ce, a method which causes $Ce(DPM)_3$ or $Ce(DPM)_4$ to rise from a Knudsen cell by virtue of sublimation may be adopted. The organic metal gas source, however, enjoys higher stability. In the diagram, 30 stands for an oven for heating a raw material. Inside a raw material container 31 made of stainless steel, a Ce-containing organic metal raw material such as, for example, a β-diketone metal complex [$Ce(DPM)_3$ or $Ce(DPM)_4$] is kept in storage. A pipe 32 interconnecting the raw material container 31 and the gas source nozzle 17 is retained under a decreased pressure not exceeding the atmospheric pressure. The pressure inside the pipe 32 is monitored by means of a pressure gauge 33. The pressures inside the raw material container 31 and the pipe 32 are controlled by means of two variable leak valves 34 and 35. The pipe, the pressure gauge, the valves, etc. are also installed inside the oven 30 so that the organic metal raw material is prevented from being condensed thereon. The amount of the Ce-containing organic metal gas to be supplied from the gas source nozzle toward the substrate 1 is controlled by the pressure inside the pipe 32 and the temperature of the oven 31 for heating the raw material. When $Ce(DPM)_3$ is used as the raw material, for example, the temperature of the oven 31 for heating the raw material is set in the range of 130° C. to 200° C. and the pressure inside the pipe 31 is set in the range of 0.01 Torr to 10 Torrs.

The RE1 element such as, for example, Ce is indispensable for the formation of multiple fluorite-structural blocks layer. For the fabrication of a superconducting element of this invention, the molecular beam epitaxy technique is effectively used. When the formation of the multiple fluorite-structural block is carried out by the use of the molecular beam epitaxy technique, the supply of Ce is accomplished with high efficiency by feeding a Ce-containing organic metal gas to the substrate. The supply of Ce is stably attained as a result. Since Ce has a low vapor pressure even at elevated temperatures, it cannot be easily vaporized by the use of a Knudsen cell. It is further at a disadvantage in respect that the amount of Ce to be vaporized by means of electron beam vapor deposition is not stable. The use of the organic metal gas source can eliminate this drawback. When the multiple fluorite-structural block layer is formed by the use of the molecular beam epitaxy technique, the layer growth can be further facilitated by supplying (RE1, RE2) and the active oxygen separately of each other and alternately.

An example of the operation of the film-forming device constructed as described above (molecular beam epitaxy device) for the superposition of single layer Pb-Sr-Ca-RE-Ca-O oxide superconducting thin films for use in an upper and a lower superconducting thin film will be described below. With the (100) face of $SrTiO_3$ as the substrate 1, an oxide superconducting thin film was formed by the following procedure.

First, the film-forming chamber 11 was evacuated of the entrapped air to below $10^{-8}$ Torr and the Knudsen cells 12, 13, 14, 15, and 16 were heated to temperatures commensurate with the speeds at which the relevant sources must be vaporized. The temperatures for vaporizing the raw materials Pb, Sr, Ca, RE2 (Eu or Dy), and Cu were respectively 600° C., 480° C., 526° C., 532° C. (or 1,033° C.), and 1,060° C. The substrate 1 was heated to 800° C. with the supply of active oxygen thereto continued meanwhile. Then, vacuum deposition of metallic components was started under continued supply of active oxygen. During the vacuum deposition, the amount of oxygen introduced was kept in the approximate range of 0.3 to 0.6 SCCM, the partial pressure of oxygen within the film-forming chamber 11 in the approximate range of 1.1 to $2\times10^{-5}$ Torrs, and the radio frequency electric power consumed in the range of 40 to 100 W. After the formation of film was completed, the shutters 19, 20, 21, 22, and 23 located directly above the relevant Knudsen cells were shut to discontinue the vacuum deposition of metallic components. The substrate kept under continued supply of active oxygen was cooled to a temperature in the range of 600° C. to 800° C. Then, the high-frequency discharge was stopped and the temperature of the substrate was lowered to below 280° C. before the sample was withdrawn from the chamber.

By following the procedure described above, a $(Pb_2Cu)Sr_2(Ca_{0.5}Eu_{0.5})Cu_2O_{8-\delta}$ superconducting thin film and a $(Pb_{0.65}Cu_{0.035})Sr_2(Ca_{0.5}Dy_{0.5})Cu_2O_{7-\delta}$ superconducting thin film can be formed. These two kinds of oxide superconductors can be fabricated discriminatively by suitably varying the composition and the conditions for exposure to active oxygen. Further, a thin film excelling in crystallinity and characteristics of superconductivity can be obtained by adapting the shutters for automatic control and superposing the components separately of one another according to the crystal structure. Moreover, such oxide superconductors as $(Pb_{0.65}Cu_{0.35})Sr_2(Ca_{0.76}Eu_{0.24})_2Cu_3O_{9-\delta}$ superconducting thin film and $(Pb_2Cu)Sr_2(Ca_{0.8}Eu_{0.2})_2Cu_3O_{10-\delta}$ superconducting thin film which have the number of $CuO_2$ planes within the unit part increased to 3 and which are never attained in the form of bulk can be produced.

Figure 6:
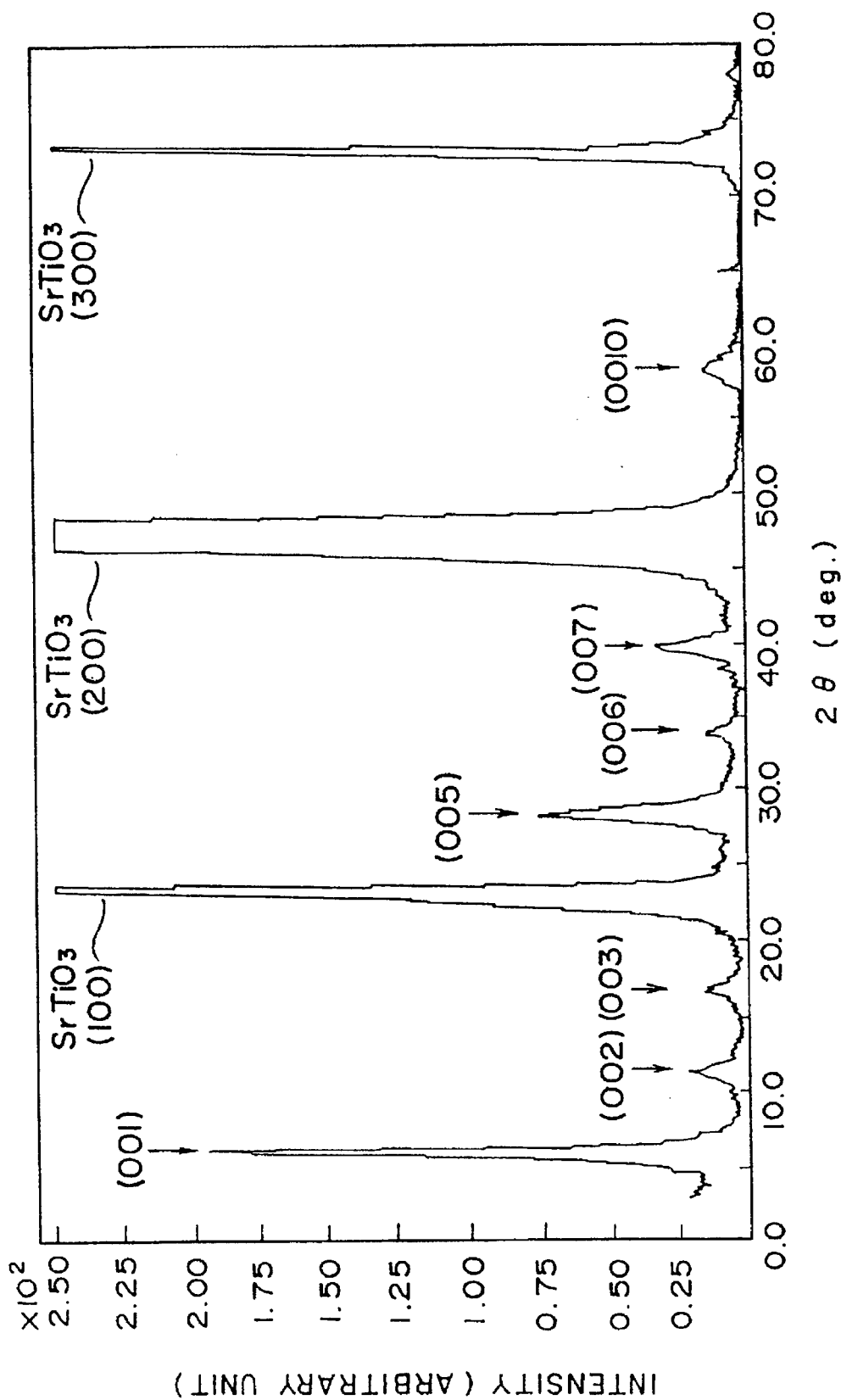
FIG. 6 is a diagram illustrating an X-ray diffraction pattern of an example oxide superconducting thin film fabricated in working examples of this invention.

Now, the case in which a $(Pb_2Cu)Sr_2(Ca_{0.5}Eu_{0.5})Cu_2O_{8-\delta}$ superconducting thin film was fabricated will be described below as one example. The components involved were superposed independently of one another in accordance with the crystal structure by automatically controlling the shutters 19, 20, 21, 22, and 23 under the conditions of active oxygen using an oxygen partial pressure of $2\times10^{-5}$ Torr and a radio frequency electric power of 100 W. The sequence of superposition was Pb+Sr(40 sec)/Pb+Sr+Cu(40 sec)/Pb+Sr(40 sec)/Ca+Eu+Cu(40 sec)/Ca+Eu(40 sec)/Ca+Eu+Cu(40 sec) as a unit part and this unit part was repeated in 30 cycles. As a result, a $(Pb_2Cu)Sr_2(Ca_{0.5}Eu_{0.5})Cu_2O_{8-\delta}$ superconducting thin film having a thickness of 47 nm was obtained. The sample was examined with an X-ray diffractometer. The results are shown in FIG. 6. A (00 n) peak alone corresponding to a c axis length of 1.58 nm was observed. This fact indicates that the c axis was strongly oriented perpendicularly to the surface of the substrate. The superconduction transition temperature $T_c$ of this thin film was about 70K. The process of growth of this thin film was monitored by reflection high energy electron diffraction (RHEED). As a result, a streak pattern and a vibration of reflection intensity were observed between the 6th cycle and the 20th cycle, indicating that a $(Pb_2Cu)Sr_2(Ca_{0.5}Eu_{0.5})Cu_2O_{8-\delta}$ layer attained growth in each unit part.

The most important thing in this case for attaining layer growth flatly to a thickness of 35 nm or more is that during the initial stage of Pb deposition, the Pb should be prevented from growing in the form of islands in an ocean. When the conditions for growth deviate from the optimum ranges, the RHEED pattern is suffered to appear in the form of spots over a period of several seconds after the shutter for the Pb source is opened during the initial stage of Pb oxide deposition and these spots continue to interfere with the subsequent layer growth. It is inferred that these spots of pattern appear after a SrPbO$_3$ base compound has continued to growth in the form of islands while maintaining an epitaxial relationship with the substrate. In the worst case, the oxide superconductor fails to acquire a crystal structure but produces a film which is oriented in the b axis of PbO$_{1.57}$ (JCPDS Card 26-577). Conversely, when the streak pattern is weakened after the shutter for the Pb source is opened during the initial stage of Pb oxide deposition and then the streak pattern is revived after the elapse of an interval between the time the diffraction pattern becomes virtually invisible and the time the deposited layer of Pb roughly reaches the thickness of ½ atomic layer, the subsequent layer growth proceeds easily.

Satisfaction of any of the following conditions for growth is effective for the purpose of realizing such initial growth of layer as described above. The first condition is that the composition of Sr in the sample of thin film should be in excess of the stoichiometric composition thereof. A 20% shortage of Sr supply hinders the growth of layer, whereas a 10% excess of Sr supply facilitates the growth of layer. If the excess of Sr is greater than 30%, however, the grown layer is adulterated with a (Pb,Cu)(Sr,Ca,RE)$_2$CuO$_{5-\delta}$ phase. The second condition is that a SrO layer should be deposited on the substrate as a buffer layer of a thickness exceeding the thickness of a monoatomic layer and not exceeding the approximate thickness of a triatomic layer. As another example of the thus effective buffer layer, a layer which is obtained by sequentially superposing the components, Sr/Cu/(Eu$_{0.5}$Ca$_{0.5}$)/Cu/Sr, in the order mentioned, with each component deposited in a thickness of a monoatomic layer (with the exception of Sr which is deposited to an approximate excess of 10%), may be cited. The third condition is that the partial pressure of oxygen is lowered exclusively during the initial stage of layer growth. To be specific, exclusively during the initial growth of one to three unit cells, the partial pressure of oxygen is decreased to about ½ of that which is to be subsequently used. The fourth condition is that the temperature of the substrate is elevated by about 20° C. exclusively during the initial growth. If the temperature of the substrate is lowered by about 20° C. during the initial stage of growth, the growth of layer is rather impeded than accelerated.

By using the first and second of the conditions for initial growth enumerated above, a (Pb$_2$Cu)Sr$_2$(Ca$_{0.5}$Eu$_{0.5}$)Cu$_2$O$_{8-\delta}$ superconducting thin film was fabricated, with the partial pressure of oxygen in the film-forming chamber 11 set at about 1.1×10$^{-5}$ Torr and the radio frequency electric power for introduction at 100 W. This compound, (Pb$_2$Cu)Sr$_2$(Ca$_{0.5}$Eu$_{0.5}$)Cu$_2$O$_{8-\delta}$, could be synthesized under a lower partial pressure of oxygen than the compound, Bi$_2$Sr$_2$CaCu$_2$O$_{8-\delta}$, which will be specifically described hereinafter. For the composition of the whole film, the Sr content was about 10% in excess of the stoichiometric level. The buffer layer in this case had the components, Sr/Cu/(Ca$_{0.5}$Eu$_{0.5}$)/ Cu/Sr/Pb/Cu/Pb/Sr/Cu/(Ca$_{0.5}$Eu$_{0.5}$)/Cu/Sr/Pb/Cu/Pb/Sr, sequentially superposed in the order mentioned. Thereafter, 25 unit cells of (Pb$_2$Cu)Sr$_2$(Ca$_{0.5}$Eu$_{0.5}$)Cu$_2$O$_{8-\delta}$ were superposed in the shutter sequence shown in the lower portion of the diagram of FIG. 7. The process of growth was monitored by RHEED. As a result, a streak pattern was continuously observed over the period between the start and the completion of growth, indicating that the layer-by-layer growth in a flat form.

Figure 7:
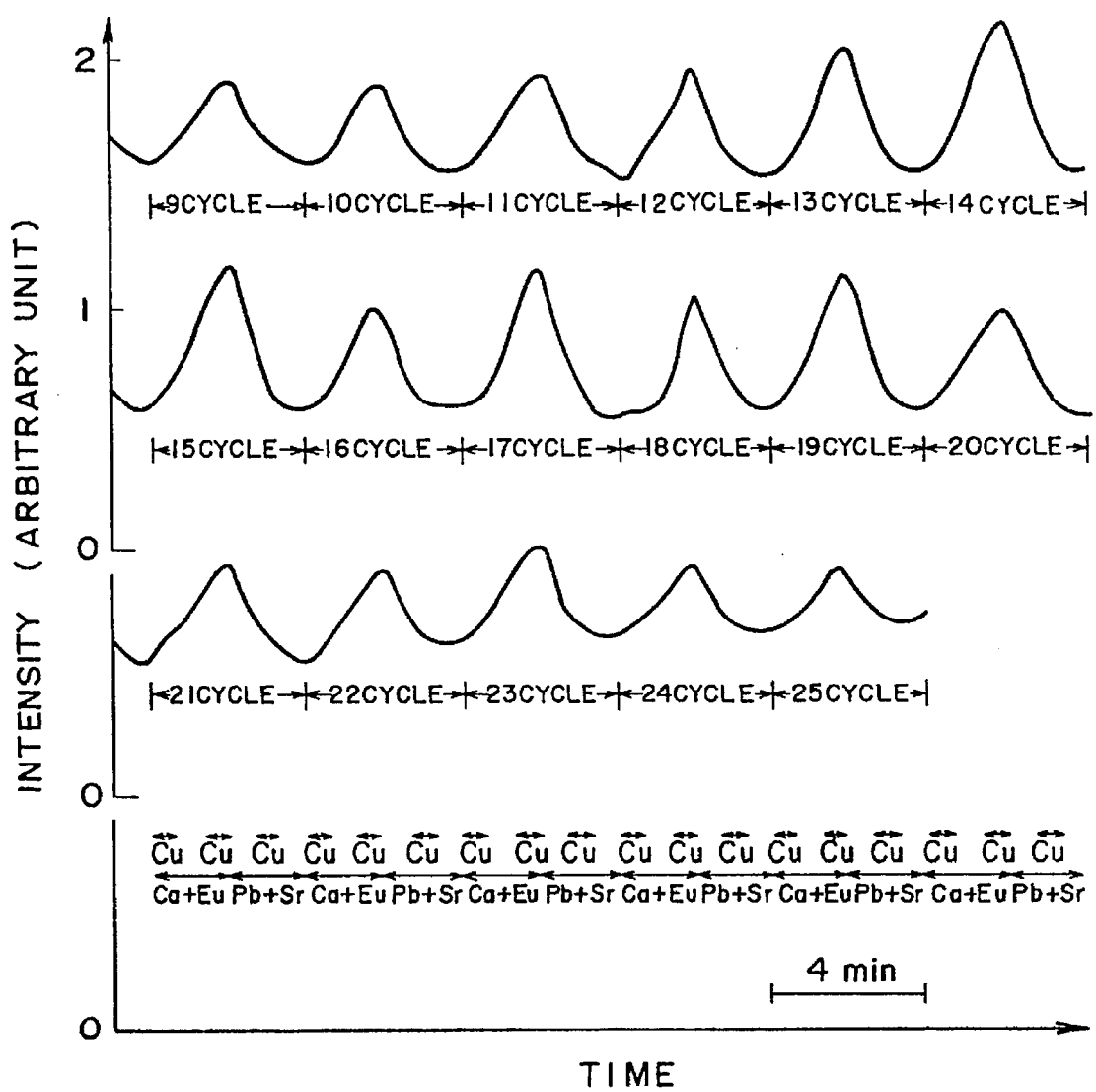
FIG. 7 is a diagram illustrating the time dependency of the intensity of a reflection high energy electron diffraction in the process of growth of an oxide superconducting film fabricated in one working example of this invention.
Figure 8:
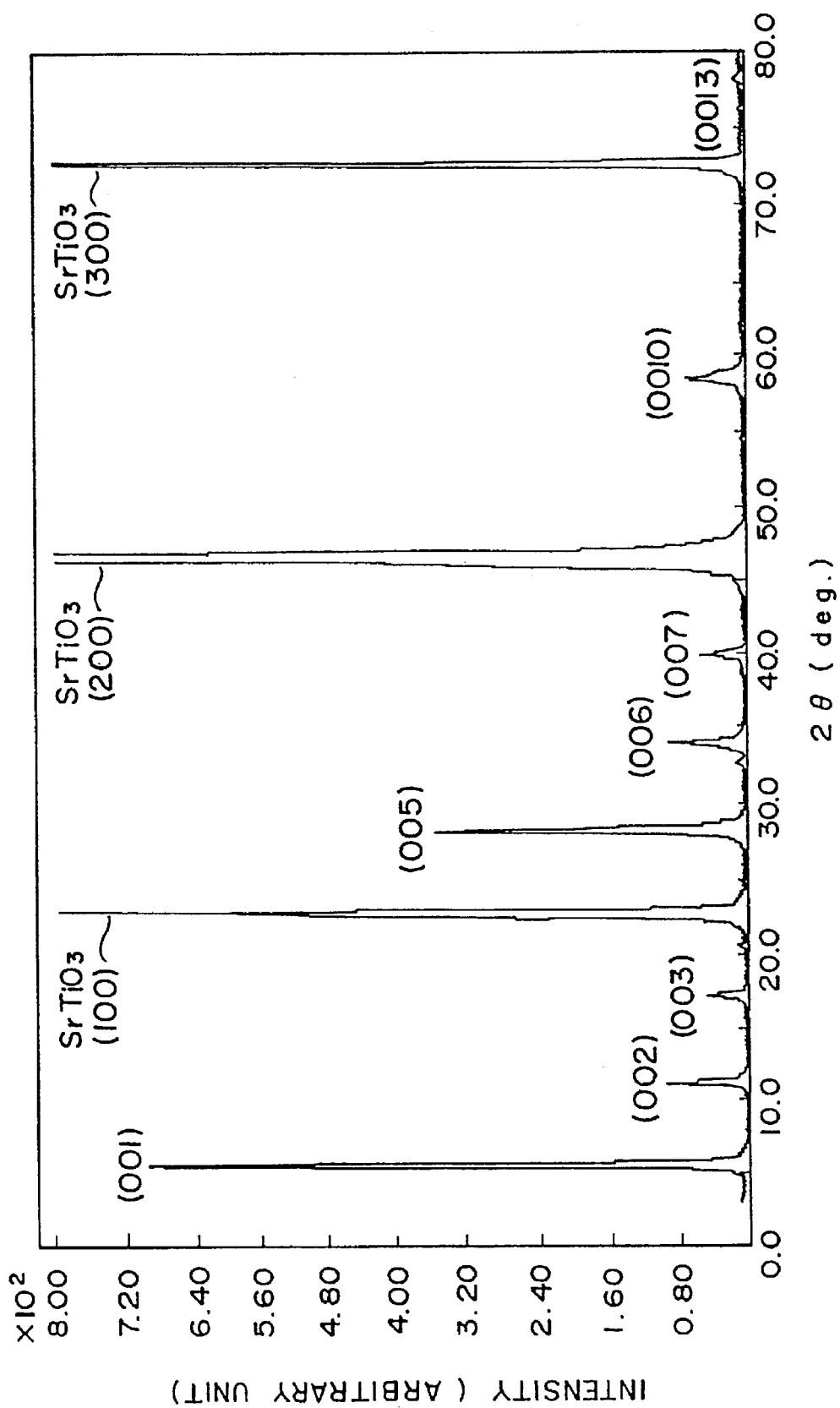
FIG. 8 is a diagram illustrating an X-ray diffraction pattern of an oxide superconducting thin film fabricated in another working example of this invention.

FIG. 7 illustrates the time-course change of reflection intensity of the central streak. It is clearly noted from this diagram that the reflection intensity vibrated in each of all the unit cells preceding the completion of growth and the layer growth proceeded with the unit cell of the c-axis length of 1.58 nm as the unit of growth. Particularly at the time that the growth of the perovskite part of Ca-Eu-Cu-O was completed, the reflection intensity was maximized and a flat surface was formed. The reflection intensity was weakened when the growth of the [PbO-Cu-PbO] block layer was started. The X-ray diffraction pattern of this sample is shown in FIG. 8. It is noted from this diagram that an oxide superconductor possessing a greater diffraction intensity, describing a sharper peak, and exhibiting more thorough orientation and crystallinity than that of FIG. 6 was obtained in this case. Incidentally, the observation of the process of growth by RHEED at times reveals that not only the reflection intensity but also the diffraction pattern shows periodic changes. It happens, for example, that spots of pattern overlap streaks of pattern during the accumulation of Pb-Sr-O and they all revert exclusively to streaks afterward.

For the purpose of comparison, a Bi$_2$Sr$_2$CaCu$_2$O$_{8-\delta}$ superconducting thin film was grown with the components thereof superposed separately of one another in accordance with the crystal structure by suitably controlling the relevant shutters and the process of this growth was visually monitored by RHEED. The formation of film was effected with the partial pressure of oxygen set at about 2×10$^{-5}$ Torrs and the radio frequency electric power for introduction at 100 W. In this system unlike that of (Pb$_2$Cu)Sr$_2$(Ca$_{0.5}$Eu$_{0.5}$)Cu$_2$O$_{8-\delta}$, the reflection intensity was maximized at the midpoint during the deposition of a [Bi$_2$O$_2$]$^{2+}$ block layer. In other words, the ½ medial cell between the adjacent BiO's constituted itself the unit of growth. It was found that (Pb$_2$Cu)Sr$_2$(Ca$_{0.5}$Eu$_{0.5}$)Cu$_2$O$_{8-\delta}$ showed clear periodic changes in streak pattern and reflection intensity and attained easy layer growth as compared with Bi$_2$Sr$_2$CaCu$_2$O$_{8-\delta}$. For the superconducting element of this invention, therefore, the [PbO-Cu-PbO]$^{1+}$ block layer is more suitable than the [Bi$_2$O$_2$]$^{2+}$ block layer. This contrast may be logically explained as follows.

At elevated temperatures of the order of the substrate temperature (about 800° C.), since the vapor pressures of Pb and Pb oxide are high, the Pb which has adhered to the substrate succumbs to vigorous re-vaporization. Thus, the amount of the Pb vapor emitted from the relevant Knudsen cell during the fabrication of (Pb$_2$Cu)Sr$_2$(Ca$_{0.5}$Eu$_{0.5}$)Cu$_2$O$_{8-\delta}$ must be set in the approximate range of 10 to 20 times the amount of the Bi vapor generated during the fabrication of Bi$_2$Sr$_2$CaCu$_2$O$_{8-\delta}$. The crystal attains growth in an atmosphere containing Pb to excess. It is surmised that either Pb or the Pb oxide is frequently repeating absorption and re-vaporization on the surface of the film in process of growth. Once the Pb enters a site which ought to admit crystal, it is no longer easily re-vaporized. Only the Pb that is necessary for the formation of crystal structure is exclusively occluded in the film and the other Pb which has been adsorbed is re-vaporized. The crystal, therefore, is formed without relying on migration and diffusion of heavy elements (Pb and Bi). It is safely concluded that the growth of layer easily proceeds in a flat form.

Figure 9:
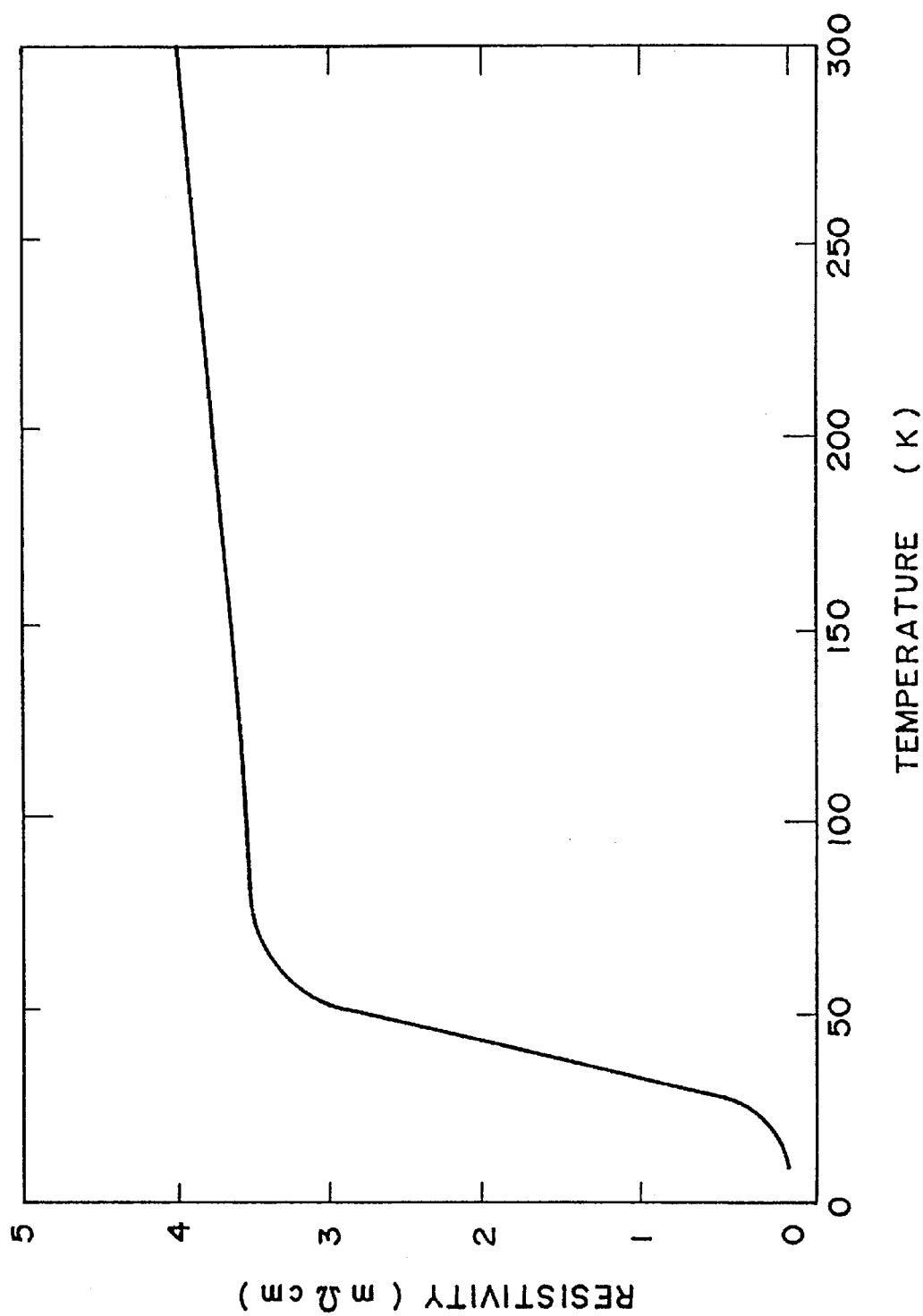
FIG. 9 is a diagram illustrating the temperature dependence of the electric resistivity of an oxide superconducting thin film fabricated in yet another working example of this invention.

An example of the fabrication of the (Pb$_2$Cu)Sr$_2$(Ca$_{0.5}$Eu$_{0.5}$)Cu$_2$O$_{8-\delta}$ superconducting thin film by another method of superposition will be cited below. The film formation was carried out with the partial pressure of oxygen set at 2×10$^{-5}$ Torrs and the radio frequency electric power for introduction at 100 W. The film was produced by sequentially superposing the components, Sr/Pb/Cu/Pb/Sr/Cu/(Ca$_{0.5}$Eu$_{0.5}$)/Cu, in the order mentioned and by repeating in 30 cycles the process through suitable control of the relevant shutters. After the film formation was completed, the supply of active oxygen to the substrate was stopped at the time that the substrate temperature fell to 600° C. The temperature at which the supply of active oxygen was stopped is higher than the temperature for the production of the $Bi_2Sr_2CaCu_2O_{8-\delta}$ superconductor. Though the component elements were superposed separately of one another, the component layers of the produced superconducting thin film were found to have grown in a flat form. When Pb alone was supplied to the substrate, the ratio of deposition of Pb to the substrate decreased to about ⅓ similarly to the first example as compared with the superposition of Pb+Sr/Pb+Sr+Cu/Pb+Sr by simultaneous supply of Sr and Cu. The produced film was found by chemical analysis to have a composition of $Pb_{0.56}Sr_{1.47}Ca_{0.55}Eu_{0.45}Cu_{2.83}O_y$. For the purpose of determining the superconduction transition temperature of this sample, this sample was tested for the electric resistivity as the function of temperature. The results are shown in FIG. 9. When the temperature was decreased, the resistivity began to decrease at about 70K and reached 0 at about 9K. It was found that the sample acquired superconductivity in spite of deficiency in Pb.

Separately, a $(Pb_2Cu)Sr_2(Ca_{0.8}Eu_{0.2})_2Cu_3O_{10-\delta}$ superconductor having the number of $CuO_2$ planes in the unit cell increased to 3 was fabricated by automatically controlling the relevant shutters thereby repeating the superposition of a unit part of Pb+Sr/Pb+Sr +Cu/Pb+Sr/Ca+Eu+Cu/Ca+Eu/Ca+Eu+Cu/Ca+Eu/Ca+Eu+Cu in 25 cycles. When this sample was examined with an X-ray diffractometer, a (00 n) peak corresponding to a c-axis length of 1.9 nm to 2.0 nm was observed in the diffraction chart.

Now, an example of the accumulation of an intermediate layer of $(Pb_2Cu)Sr_2(Ce_{1-y}Eu_y)_{m+1}Cu_2O_{8+2m-\delta}$ by means of the film-forming device described above will be cited below. Incidentally, when the accumulation is effected by the molecular beam epitaxy technique, it is desirable to use as the RE2 element in the fluorite type block such an element as Eu, Sm, or Dy which has a high vapor pressure at elevated temperatures.

First, Pb, Cu, Sr, and Eu were vaporized from the relevant Knudsen cells and a $Ce(DPM)_3$ organic metal gas was supplied meanwhile. At the same time, the substrate was irradiated with active oxygen under the same conditions as in the preceding example. The $Ce(DPM)_3$ was decomposed on the heated substrate and Ce was deposited on the substrate. Incidentally, in the conventional bulk, a compound of $m \geq 3$ could not be synthesized in a single phase [A. Tokiwa et al., Physica C., Vol. 181, pp. 311 to 319 (1991)]. In contrast thereto, the present invention allows compounds whose values of m range from 2 to 100 to be synthesized in a single phase by automatically controlling the shutters 19, 20, 21, 22, 23, and 24 thereby superposing the component elements separately of one another in accordance with the crystal structure. It also allows a layer to grow epitaxially on the lower superconducting layer.

As a preliminary experiment, a single phase was obtained by repeating the superposition of 30 unit parts of compound layers destined to form an intermediate layer. This preliminary experiment resulted in comprehension of film-forming conditions (substrate temperature, irradiation with active oxygen, etc.) for easy layer growth. When a layer of $(Pb_2Cu)Sr_2(Ce_{1-y}Eu_y)_7Cu_2O_{20-\delta}$ containing a six layer fluorite type block was grown, the unit part was Pb+Sr (40 sec)/Pb+Sr+Cu (40 sec)/Pb+Sr (40 sec)/Cu (40 sec)/Ce+Eu (18 sec)/Ce (300 sec)/Ce+Eu (18 sec)/Cu (40 sec) in the order of superposition. This unit part was repeated 30 cycles. In this case, for the purpose of enabling the $CuO_2$ planes included in the intermediate layer to remain in an electrically active state, the value of y was set at 0.2 with allowance for an oxygen defect $\delta=0$ so that Eu would occupy the Al site adjoining the $CuO_2$ planes. The average ionic radius R (Al) of the Al site adjoining the $CuO_2$ planes was 0.1037 nm. By monitoring the process of growth by RHEED, it was confirmed that the layers grew severally for unit parts similarly to the case of FIG. 7. Streaks of pattern were observed during the accumulation of the multiple layer fluorite type block $[(Ce,Eu)O_2]_{m+1}$. This fact indicates that the layers grew in a flat form. This layer growth may be possibly evinced by the fact that the local analysis of the interior of the unit part reveals a lattice mismatch of not more than 1% between the lattice constant of $CeO_2$ (a=0.5409 nm) and that of the layered copper oxide superconductor.

The streaks of pattern are made to appear more clearly and the growth of layer is allowed to proceed more easily by having (Ce,RE2) and active oxygen supplied separately of each other and alternately. The supply of this particular manner is attained, for example, by keeping the shutter 29 for active oxygen in a closed state and repeating a procedure which comprises keeping the shutter 22 on the Knudsen cell for Eu and the shutter 24 for the Ce gas source open for a period (about 60 seconds) equal to the time for the accumulation of a monoatomic layer, then closing these shutters, and thereafter keeping the shutter 29 for active oxygen open for a period in the approximate range of 10 to 60 seconds.

By causing a copper oxide superconducting film to grow as an upper superconducting layer under the same conditions as those described above on the aforementioned copper oxide compound layer as an intermediate layer, the layers could be grown epitaxially. As a result, a three layer laminated structure having the component layers epitaxially grown and exhibiting ideal lattice matching was obtained.

The embodiment described thus far represents a case of using the molecular beam epitaxy technique for the fabrication of a three layer laminate type Josephson junction as one embodiment of this invention. Even by the other film-forming methods such as the spattering method, the cluster ion beam method, and CVD method, the superconducting element contemplated by the present invention can be similarly fabricated by causing the component elements to be superposed separately of one another in accordance with the crystal structure.

Now, concrete examples of the fabrication of a three layer laminate type Josephson junction according to one embodiment of this invention by the use of the film-forming method and film-forming conditions mentioned above will be cited below.

EXAMPLE 1

Figure 10:
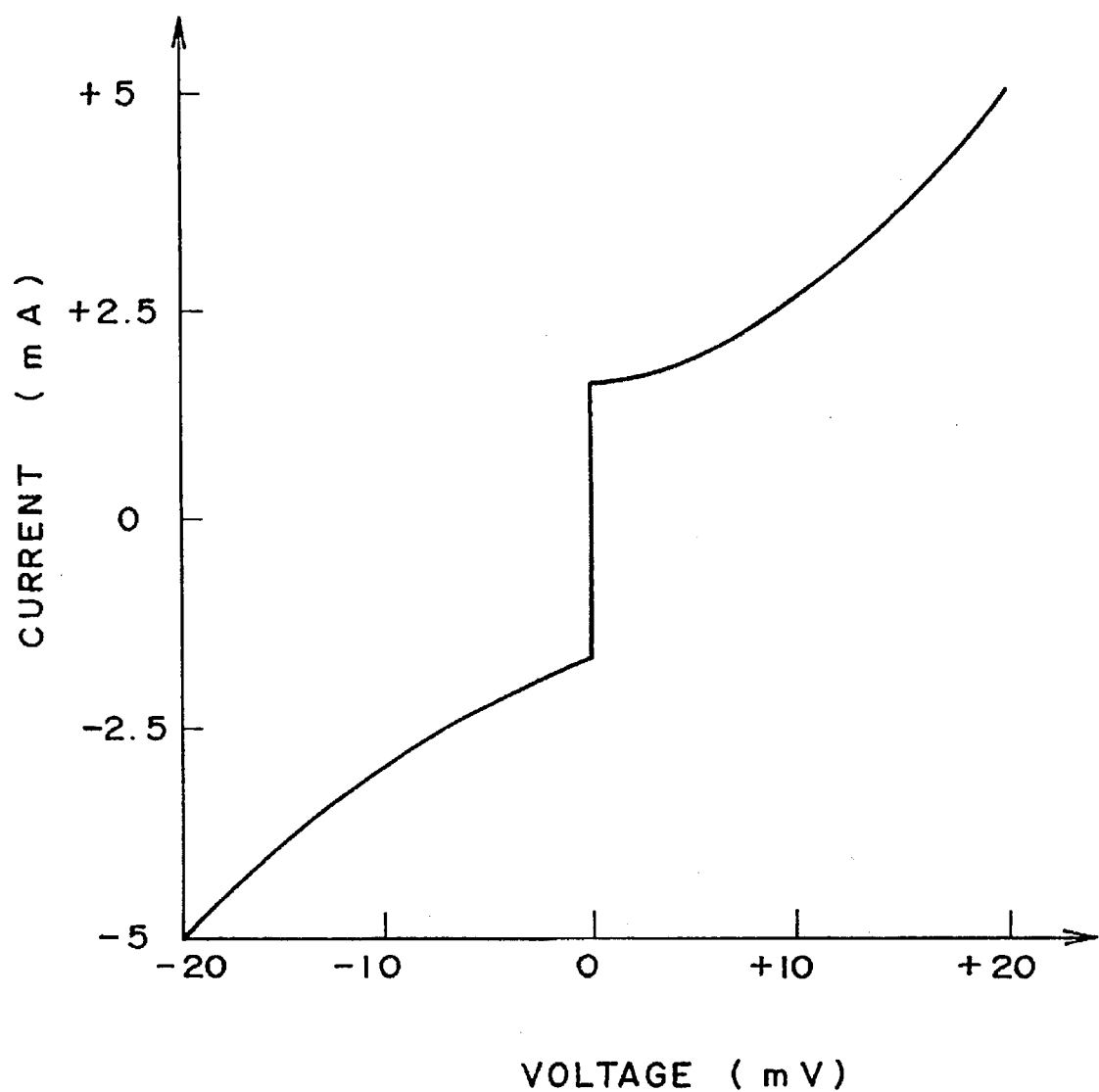
FIG. 10 is a diagram illustrating the current-voltage characteristics of a laminate Josephson element as one embodiment of this invention.

The (100) face of a $SrTiO_3$ single crystal was used as a substrate 1 and $(Pb_2Cu)Sr_2(Ca_{0.5}Eu_{0.5})Cu_2O_{8-\delta}$ superconducting thin films equivalent to 50 unit cells (79 nm) were superposed to form a lower superconducting layer 2. With the substrate temperature kept at an elevated level, one unit part of $(Pb_2Cu)Sr_2(Ce_{1-y}Eu_y)_{m+1}Cu_2O_{8+2m-\delta}$ (m=7) was accumulated to form an intermediate layer 3. The thickness of the multiple layer fluorite-structural type block which functioned as an insulating layer in this case, measured as the distance between the adjacent $CuO_2$ planes, was found to be about 2.2 nm. For the accumulation of the intermediate layer 3, the film-forming conditions (such as the substrate temperature, the conditions for exposure to active oxygen, and the sequence of superposition) which were found by the aforementioned preliminary experiment to produce a single phase and allow easy layer growth were adopted. Further, as an upper superconducting layer 4, $(Pb_2Cu)Sr_2(Ca_{0.5}Eu_{0.5})Cu_2O_{8-\delta}$ superconducting thin films equivalent to 50 unit cells (79 nm) were accumulated. The accumulation of thin films was invariably carried out while the growth of layer was confirmed by RHEED. Thereafter, the laminate film mentioned above was subjected to a patterning treatment by means of a metal mask and an ion milling to extract electrodes from the lower superconducting layer 2 and the upper superconducting layer 4. The current-voltage characteristics of the Josephson junction obtained as described above were determined at 40K. The results are shown in FIG. 10. It is clearly noted from FIG. 10 that this junction manifested the Josephson effect conspicuously.

EXAMPLE 2

The (100) face of a $SrTiO_3$ single crystal was used as a substrate 1 and a $(Pb_{0.65}Cu_{0.35})Sr_2(Ca_{0.5}Dy_{0.5})Cu_2O_{7-\delta}$ superconducting thin film ($T_c$=80K) was grown first thereon as a lower superconducting layer 2. On this lower superconducting layer 2, one unit cell of $(Pb_{0.65}Cu_{0.35})Sr_2(Eu, Ce)_7Cu_2O_z$ containing a six layer fluorite-structural type block was grown as an intermediate layer 3. Then, further on this intermediate layer 3, a $(Pb_{0.65}Cu_{0.35})Sr_2(Ca_{0.76}Dy_{0.24})_2Cu_3O_{9-\delta}$ superconducting thin film ($T_c$=90K) was formed as an upper superconducting layer 4. This laminated structure is depicted from the viewpoint of crystal structure in FIG. 4. This laminate film was subjected to a patterning treatment using a metal mask and an ion milling and electrodes were drawn out of the lower superconducting layer 2 and the upper superconducting layer 4. The current-voltage characteristics of the Josephson junction obtained as described above were determined. This junction manifested the Josephson effect clearly.

EXAMPLE 3

The (100) face of a $SrTiO_3$ single crystal was used as a substrate 1 and a $Bi_2Sr_2Ca_2Cu_3O_{10-\delta}$ superconductor was grown first thereon as a lower superconducting layer 2. On the lower superconducting layer 2, one unit part of $Bi_2Sr_2(Sm,Ce)_9Cu_2O_z$ containing an eight layer fluorite-structural type block was grown as an intermediate layer 3. Then, further thereon, a $Bi_2Sr_2CaCu_2O_{8-\delta}$ superconducting thin film was formed as an upper superconducting layer 4. The laminate film consequently obtained was subjected to a patterning treatment using a metal mask and an ion milling and electrodes were drawn out of the lower superconducting layer 2 and the upper superconducting layer 4. When the produced Josephson junction was tested for current-voltage characteristics, it was confirmed that the junction clearly manifested the Josephson effect.

The embodiments thus far cited represent cases of utilizing the superconducting element of this invention for S/I/S tunnel type junction elements. The superconducting element of this invention, when necessary, can be utilized for superconducting three-terminal elements as well. The S/I/S/I/S type superconducting three-terminal element, for example, is obtained by having two S/I/S junctions superposed one on top of the other. When an electric current is passed through one of the S/I/S junctions while this Junction is retained in a state of generating a potential, the quasi particles in process of tunneling this junction stagnate in the central S layer and vary the current-voltage characteristics of the other S/I/S junction and cause the composite junction to serve as a three-terminal element. Here, the thickness of the one layer of these two junctions must be changed so that the component junctions will acquire the optimum current-voltage characteristics of their own. The three-terminal element of this kind can be realized by mutually superposing two S/I/S tunnel type Josephson junctions which have the thin films of this invention superposed in three layers. By giving suitably varied thicknesses to the multiple layer fluorite-structural type blocks in two junctions, a superconducting element having mutually different characteristic properties in the two junctions and allowing the two junctions to exhibit severally optimum current-voltage characteristics can be fabricated.

Figure 11:
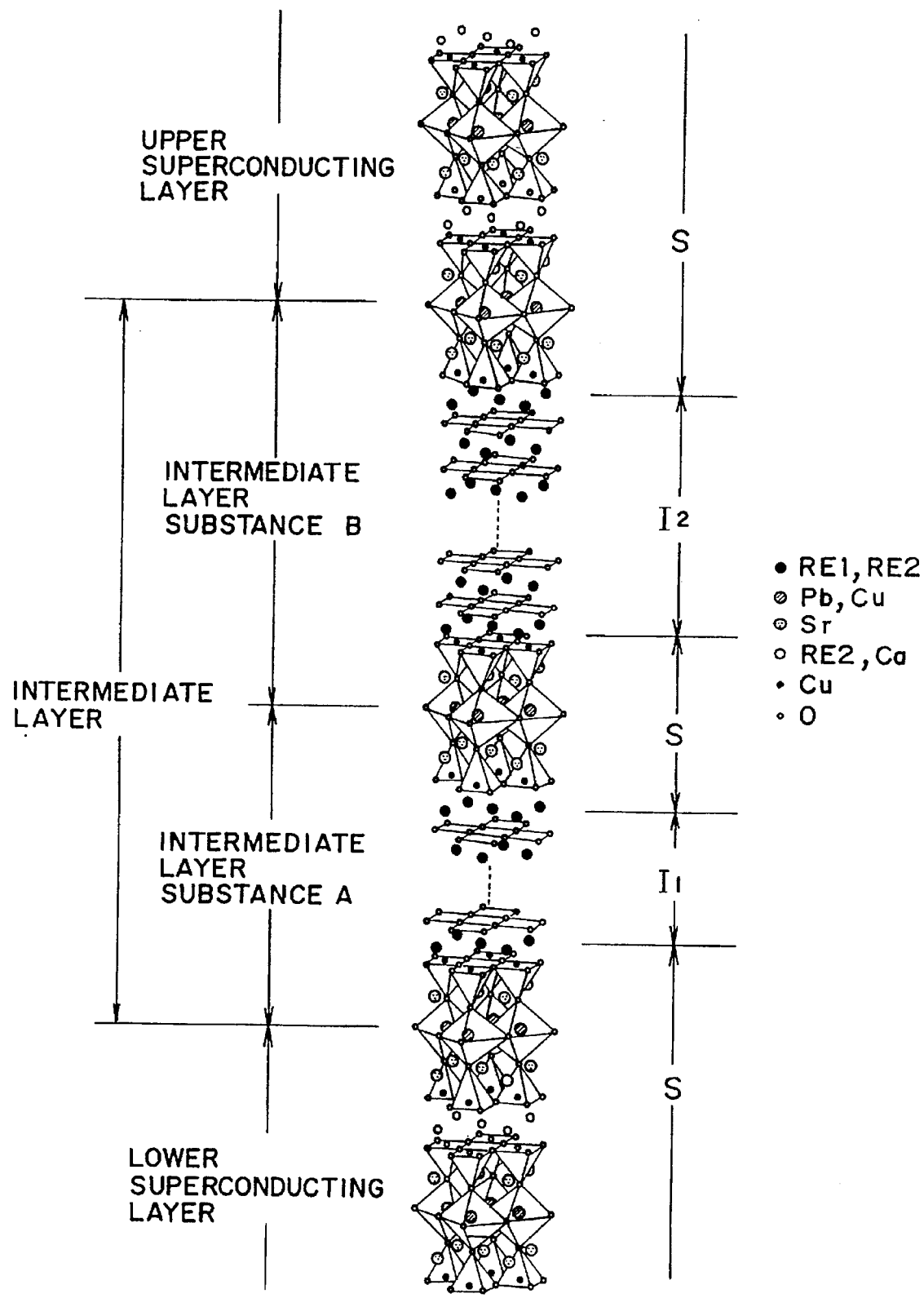
FIG. 11 is a model diagram illustrating a case of application of the superconducting element of this invention to a superconducting three-terminal element possessing an S/I/S/I/S junction from the viewpoint of crystal structure.

Particularly, this invention, for example as illustrated in FIG. 11, can realize a three-terminal element ($S/I_1/S/I_2/S$) having an extremely thin central S layer by superposing intermediate layers (intermediate layer substance A and intermediate layer substance B) containing two unit parts of multiple layer fluorite-structural type blocks. It also permits easy fabrication of a three-terminal element using insulating layers of mutually different thicknesses (the thicknesses of $I_1$ layer and $I_2$ layer). Since the central S layer can be given an extremely small thickness, the density of quasi particles stagnating in this layer is increased and the efficiency of operation of the element can be enhanced. Further, owing to the extremely small thickness of the central S layer, the current of quasi particles and the current of superconduction which tunnel the uppermost S layer through the lowermost S layer can be also utilized for the operation of the element. In the three-terminal element which is called a gap tunnel transistor, for example, the probability with which the currents mentioned above tunnel the uppermost superconducting electrodes through the lowermost superconducting electrode can be varied by suitably varying the potential of the S layer (base) interposed at the center. This element benefits by the extremely small thickness of the central S layer.

A superconducting base transistor can be realized by superposing a semiconducting layer on (or beneath) the S/I/S tunnel type Josephson junction having the thin films of this invention superposed in three layers. The S/I/S Junction in this case discharges the role of generating quasi particles intended for injection into the semiconducting layer. Further, a quasi particle injection type three-terminal element of the S/I/S/N/S structure can be realized by superposing a S/N/S junction on (or beneath) the S/I/S tunnel type Josephson junction having the thin films of this invention superposed in three layers. The S/I/S junction in this plays the part of generating quasi particles intended for injection into the S/N/S junction.

Now, an example of the application of the superconducting element of this invention to a DC transformer will be cited below.

As illustrated in FIG. 12, the (100) face of a $SrTiO_3$ single crystal was used as a substrate and a $(Pb_2Cu)Sr_2(Ca_{0.5}Eu_{0.5})Cu_2O_{8-\delta}$ superconductor was accumulated to a thickness equal to 50 unit cells (79 nm) as a lower superconducting layer 41. Subsequently, a $(Pb_2Cu)Sr_2(Ce_{1-y}Eu_y)_{m+1}Cu_2O_{8+2m-\delta}$ (m=70) was accumulated thereon in a thickness equal to one unit part as an intermediate layer 42. The thickness of the multiple layer fluorite-structural type block which functions as an insulating layer herein, measured as the distance between the adjacent $CuO_2$ planes, is about 19.5 nm. Further, a $(Pb_2Cu)Sr_2(Ca_{0.5}Eu_{0.5})Cu_2O_{8-\delta}$ superconductor was accumulated thereon in a thickness equal to 50 unit cells (79 nm) as an upper superconducting layer 43. Electrodes were drawn out of the lower superconducting layer 41 and the upper superconducting layer 43 and were used for determination of the current-voltage characteristics of the produced element. As a result, no Josephson effect was observed. To be more specific, the tunneling phenomenon of Cooper pairs failed to occur in the path from the upper superconducting layer 43 to the lower superconducting layer 41 and the flow of superconduction current did not occur.

Then, a sample of the laminate film mentioned above was kept at a temperature about 5K lower than the temperature at which the resistance of the upper superconducting layer 43 or lower superconducting layer 41 was zero and a magnetic field of 0.003 T was applied perpendicularly to the surface of the film. In this sample as illustrated in FIG. 12, an electric current I was passed through the lower superconducting layer 41 and the voltage $V_0$ of the lower superconducting layer 41 and the voltage $V_1$ of the upper superconducting layer 43 were measured. In the lower superconducting layer 41, the voltage $V_0$ due to flux creep was generated. In the upper superconducting layer 43, the voltage $V_1$ was generated on the same order as the voltage $V_0$ in spite of the absence of flow of an electric current to the upper superconducting layer 43. Thus, it has been established that the produced element functioned as a DC transformer. It is inferred that the upper superconducting layer 43 generated the voltage as described above because the Boltex which had penetrated the upper superconducting layer 43 was put to work according as the Boltex which had penetrated the lower superconducting layer 41 was put to motion under the influence of the Lorentz force from the electric current I.

A highly efficient DC transformer can be realized by using cuprate superconductors for an upper layer and a lower layer and, at the same time, applying a magnetic field perpendicularly to the $CuO_2$ planes. For the realization of the DC transformer, the thickness of the intermediate layer is desired to be in the approximate range of 10 nm to 20 nm. In this case, the layer cuprate layer of the intermediate layer may be accumulated to a thickness equal to about 2 to 12 unit parts instead of just one unit part.

What is claimed is:

1. A superconducting element, comprising:
   a lower superconducting layer comprising a first layered copper oxide compound, said first layered copper oxide compound being superconducting;
   an intermediate layer superposed on said lower superconducting layer and comprising second layered copper oxide compound, said second layered copper oxide compound comprising:
   $CuO_2$ planes,
   a multiple block layer interposed between the $CuO_2$ planes and having a composition represented by the chemical formula of $\{(RE1_{1-y}RE2_y)O_2\}_{m+1}$ and a crystal structure of fluorite in which a layer of cations of RE1 or RE2 and a layer of $O^{2-}$ anions are alternatively stacked, and
   second block layers superposed on the $CuO_2$ planes, the second block layers consisting of at least one member selected from the group consisting of $\{Bi_2O_2\}^{2+}$, $\{Tl_2O_2\}^{2+}$, $\{TlO\}^{1+}$, $\{PbO\text{-}Cu\text{-}PbO\}^{1+}$, $\{(Pb,Cu)O\}^{1+}$, and $CuO_\delta$ chain, and alkali earth elements, wherein δ stands for an oxygen amount; and
   an upper superconducting layer superposed on said intermediate layer and comprising a third layered copper oxide compound, said third layered copper oxide compound being superconducting,
   wherein RE1 is at least one element selected from the group consisting of lanthanide elements and actinoid elements which form ions of valency of more than 3, RE2 is at least one element selected from the group consisting of yttrium and lanthanide elements, which form ions of valency of 3, y is a number satisfying $0 \leq y < 1$, and m is a number satisfying $2 \leq m \leq 100$.

2. A superconductive element according to claim 1, wherein said first and third layered copper oxide compounds are at least one selected from the group consisting of $Bi_2Sr_2Ca_{n-1}Cu_nO_z$, $Tl_2Ba_2Ca_{n-1}Cu_nO_z$, $TlBa_2Ca_{n-1}Cu_nO_z$, $(Pb_2Cu)Sr_2(Ca,RE)_{n-1}Cu_nO_z$, $(Pb,Cu)Sr_2(Ca,RE)_{n-1}Cu_nO_z$, and $REBa_2Cu_3O_{7-\delta}$, where n=1 to 4, z stands for an oxygen content, RE stands for a rare earth element, and δ stands for oxygen deficiency.

3. A superconductive element according to claim 1, wherein said RE1 is at least one selected from the group consisting of $Ce^{4+}$, $Pr^{4+}$, $Tb^{4+}$, $Th^{4+}$, $Pa^{4+}$, and $U^{4+}$.

4. A superconductive element according to claim 1, wherein said RE2 is at least one selected from the group consisting of $Pr^{3+}$, $Nd^{3+}$, $Sm^{3+}$, $Eu^{3+}$, $Gd^{3+}$, $Tb^{3+}$, $Dy^{3+}$, $Ho^{3+}$, $Er^{3+}$, $Tm^{3+}$, $Yb^{3+}$, $Lu^{3+}$, and $Y^{3+}$.

5. A superconductive element according to claim 1, wherein y is not more than 0.6.

6. A superconducting element according to claim 1, wherein said cations of RE2 substantially localize at the cation sites adjoining the $CuO_2$ planes, and said cations of RE1 substantially occupy the cation sites in the center region of the multiple block layer.

7. A superconducting element according to claim 6, wherein an average ionic radius of said cations of RE2 at the cation sites adjoining $CuO_2$ planes is in the range of 0.1007 to 0.108 nm.

8. A superconductive element according to claim 1, wherein said superconductive element forms a superconductor-insulator-superconductor Josephson junction.

9. A superconducting element according to claim 2, wherein said first layered copper oxide compound has a composition of $Bi_2Sr_2Ca_{n-1}Cu_nO_z$, said second layered copper oxide has a composition of $Bi_2Sr_2\{(RE1_{1-y}RE2_y)O_2\}_{m+1}Cu_2O_z$, and said third layered copper oxide compound has a composition of $Bi_2Sr_2Ca_{n-1}Cu_nO_z$.

10. A superconducting element according to claim 2, wherein said first layered copper oxide compound has a composition of $(Pb,Cu)Sr_2(Ca,RE)_{n-1}Cu_nO_z$, said second layered copper oxide has a composition of $(Pb,Cu)AE_2\{(RE1_{1-y}RE2_y)O_2\}_{m+1}Cu_nO_z$, and said third layered superconducting copper oxide compound has a composition of $(Pb,Cu)Sr_2(Ca,RE)_{n-1}Cu_nO_z$, wherein AE is at least one element selected from alkali earth elements, RE is a rare earth element, RE1 is at least one element from the group consisting of lanthanide elements and actinoid elements which forms ions of valency of more than 3, RE2 is at least one element from the group consisting of yttrium and lanthanide elements which form ions of valency of 3, y is a number satisfying $0 \leq y < 1$, n is a number from 1 to 4, m is a number satisfying $2 \leq m \leq 100$, and z is an oxygen content.

11. A superconducting element, comprising:
    a lower superconducting layer comprising a first layered copper oxide compound, wherein said first layered copper oxide compound has a composition of $(Pb_2Cu)Sr_2(Ca,RE)_{n-1}Cu_nO_z$,
    an intermediate layer superposed on said lower superconducting layer and comprising a second layered copper oxide compound, wherein said second layered copper oxide has a composition of $(Pb_2Cu)AE_2\{(RE1_{1-y}RE2_y)O_2\}_{m+1}Cu_2O_z$, and
    an upper superconducting layer comprising a third layered copper oxide compound, wherein said third layered copper oxide compound has a composition of $(Pb_2Cu)Sr_2(Ca,RE)_{n-1}Cu_nO_z$,
    wherein AE is at least one element selected from alkali earth elements, RE is an rare earth element, RE1 is at least one element from the group consisting of lanthanide elements and actinoid elements which form ions of valency of more than 3, RE2 is at least one element from the group consisting of yttrium and lanthanide elements which form ions of valency of 3, y is a number satisfying $0 \leq y < 1$, n is a number from 1 to 4, m is a number satisfying $2 \leq m \leq 100$, and z is an is an oxygen content.

12. A superconducting element comprising:

a lower superconducting layer comprising a first layered copper oxide compound, wherein said first layered copper oxide compound has a composition of $Tl_2Ba_2Ca_{n-1}Cu_nO_z$, an intermediate layer superposed on said lower superconducting layer and comprising a second layered copper oxide compound, wherein said second layered copper oxide has a composition of $Tl_2Ba_2\{(RE1_{1-y}RE2_y)O_2\}_{m+1}Cu_2O_z$, and an upper superconducting layer comprising a third layered copper oxide compound, wherein said third layered copper oxide compound has a composition of $Tl_2Ba_2Ca_{n-1}Cu_nO_z$, wherein AE is at least one element selected from alkali earth elements, RE1 is at least one element from the group consisting of lanthanide elements and actinoid elements which form ions of valency of more than 3, RE2 is at least one element from the group consisting of yttrium and lanthanide elements which form ions of valency of 3, y is a number satisfying $0 \leq y < 1$, n is a number from 1 to 4, m is a number satisfying $2 \leq m \leq 100$, and z is an oxygen content.

13. A superconducting element, comprising, a lower superconducting layer comprising a first layered copper oxide compound wherein said first layered copper oxide compound has a composition of $Tl_2Ba_2Ca_{n-1}Cu_nO_z$;

an intermediate layer superposed on said lower superconducting layer and comprising a second layered copper oxide compound, wherein said second layered copper oxide has a composition of $TlAE_2\{(RE1_{1-y}RE2_y)O_2\}_{m+1}Cu_2O_z$; and an upper superconducting layer comprising a third layered copper oxide compound, wherein said third layered superconducting copper oxide compound has a composition of $TlBa_2Ca_{n-1}Cu_nO_z$, wherein AE is at least one element selected from alkali earth elements, RE1 is at least one element from the group consisting of lanthanide elements and actinoid elements which form ions of valency of more than 3, RE2 is at least one element from the group consisting of yttrium and lanthanide elements which form ions of valency of 3, y is a number satisfying $0 \leq y < 1$, n is a number from 1 to 4, m is a number satisfying $2 \leq m \leq 100$, and z is an oxygen content.

14. A superconducting element, comprising:

a lower superconducting layer comprising a first layered copper oxide compound, wherein said first layered superconducting copper oxide compound has a composition of $RE_2Ba_2Cu_3O_{7-\delta}$;

an intermediate layer superposed on said lower superconducting layer and comprising a second layered copper oxide compound, wherein said second layered copper oxide has a composition of $CuAE_2\{(RE1_{1-y}RE2_y)O_2\}_{m+1}Cu_2O_z$; and an upper superconducting layer comprising a third layered copper oxide compound, wherein said third layered copper oxide compound has a composition of $RE_2Ba_2Cu_3O_{7-\delta}$, wherein AE is at least one element selected from alkali earth elements, RE is a rare earth element, RE1 is at least one element from the group consisting of lanthanide elements and actinoid elements which form ions of valency of more than 3, RE2 is at least one element from the group consisting of yttrium and lanthanide elements which form ions of valency of 3, y is a number satisfying $0 \leq y \leq 1$, n is a number from 1 to 4, m is a number satisfying $2 \leq m < 100$, z is an oxygen content, and $\delta$ is an oxygen deficiency.

15. A superconducting element comprising:

a lower superconducting layer comprising a first layered copper oxide compound, said first layered copper oxide compound being superconducting;

an intermediate layer superposed on said lower superconducting layer and comprising second layered copper oxide compound having a crystal structure which includes a multiple block having the crystal structure of fluorite in a part of said crystal structure, said second layered copper oxide compound having a composition represented by the chemical formula of $\{B\}AE_2\{(RE1_{1-y}RE2_y)O_2\}_{m+1}Cu_2O_z$; and an upper superconducting layer superposed on said intermediate layer and comprising a third layered copper oxide compound, said a third layered copper oxide compound being superconducting, wherein $\{B\}$ is at least one member selected from the group consisting of $\{Bi_2O_2\}^{2+}$, $\{Tl_2O_2\}^{2+}$, $\{TlO\}^{1+}$, $\{PbO\text{-}Cu\text{-}PbO\}^{1+}$, $\{(Pb,Cu)O\}^{1+}$, and $CuO_\delta$ chain, AE is an alkali earth element, RE1 is at least one element selected from the group consisting of lanthanide elements and actinoid elements which form ions of valency of more than 3, RE2 is at least one element from the group consisting of yttrium and lanthanide elements which form ions of valency of 3, y is a number satisfying $0 \leq y \leq 1$, m is a number satisfying $2 \leq m < 100$, z is an oxygen content, and $\delta$ is an oxygen amount, and wherein said multiple block layer having the crystal structure of fluorite has a composition represented by the chemical formula of $\{(RE1_{1-y}RE2_y)O_2\}_{m+1}$, in which a layer of cations of RE1 or RE2 and a layer of $O^{2-}$ anions are alternately stacked, and said multiple block layer is interposed between $CuO_2$ planes.

16. A superconducting element, comprising:

a lower superconducting layer comprising a first layered copper oxide compound having a composition represented by the chemical formula of $Bi_2Sr_2Ca_{n-1}Cu_nO_z$, where n=1 to 4, and z is an oxygen content;

an intermediate layer superposed on said lower superconducting layer and comprising second layered copper oxide compound having a composition represented by the chemical formula of $Bi_2Sr_2\{(RE1_{1-y}RE2_y)O_2\}_{m+1}Cu_nO_z$, wherein RE1 is at least one element from the group consisting of yttrium and lanthanide elements which form ions of valency of more than 3, RE2 is at least one element selected from the group consisting of yttrium, lanthanide elements, and actinoid elements which form ions of valency of 3, y is a number satisfying $0 \leq y < 1$, m is a number satisfying $2 \leq m \leq 100$, and z is an oxygen content, and the part represented by $\{(RE1_{1-y}RE2_y)O_2\}_{m+1}$ in the chemical formula has a crystal structure of fluorite in which a layer of cations of RE1 or RE2 and a layer of $O^{2-}$ anions are alternately stacked; and an upper superconducting layer superposed on said intermediate layer and comprising a third layered copper oxide compound having a composition represented by the chemical formula of $Bi_2Sr_2Ca_{n-1}Cu_nO_z$, where n=1 to 4, and z is an oxygen content.

* * * * *

UNITED STATES PATENT AND TRADEMARK OFFICE
CERTIFICATE OF CORRECTION

PATENT NO. : 5,629,267
DATED : May 13, 1997
INVENTOR(S) : Sumio IKEGAWA et al.

It is certified that error appears in the above-indentified patent and that said Letters Patent is hereby corrected as shown below:

Claim 9, column 22, lines 32-33, "$_{m+\ 1}Cu_2O_z$" should read --$_{m+1}Cu_2O_z$--.

Claim 11, column 22, line 65, "an rare" should read --a rare--.

Claim 11, column 23, lines 5-6, delete "is an" (second occurrence).

Claim 12, column 23, line 28, after "number", delete ".".

Claim 13, column 23, line 32, after "compound" insert --,--.

Claim 14, column 24, line 6, "$0 \leq y \leq 1$" should read --$0 \leq y < 1$--.

UNITED STATES PATENT AND TRADEMARK OFFICE
CERTIFICATE OF CORRECTION

PATENT NO. : 5,629,267
DATED : May 13, 1997
INVENTOR(S) : Sumio IKEGAWA et al.

It is certified that error appears in the above-indentified patent and that said Letters Patent is hereby corrected as shown below:

Claim 14, column 24, line 7, "$2 \leq m < 100$" should read --$2 \leq m \leq 100$--.

Claim 15, column 24, line 33, "$0 \leq y \leq 1$" should read --$0 \leq y < 1$--, and "$2 \leq m < 100$" should read --$2 \leq m \leq 100$--.

Claim 16, column 24, lines 49-50, "$_{m+1}Cu_nO_z$" should read --$_{m+1}Cu_nO_z$--.

Signed and Sealed this

Tenth Day of March, 1998

BRUCE LEHMAN

Attest:

Attesting Officer

Commissioner of Patents and Trademarks